United States Patent
Cheon et al.

(10) Patent No.: US 9,461,132 B2
(45) Date of Patent: Oct. 4, 2016

(54) SEMICONDUCTOR DEVICE HAVING MID-GAP WORK FUNCTION METAL GATE ELECTRODE

(71) Applicant: Samsung Electronics Co., Ltd., Suwon-si (KR)

(72) Inventors: Keon-Yong Cheon, Yongin-si (KR); Il-Ryong Kim, Hwaseong-si (KR); Dong-Won Kim, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/511,193

(22) Filed: Oct. 10, 2014

(65) Prior Publication Data
US 2015/0263004 A1     Sep. 17, 2015

(30) Foreign Application Priority Data
Mar. 12, 2014  (KR) .................. 10-2014-0029052

(51) Int. Cl.
| | | |
|---|---|---|
| *H01L 21/70* | (2006.01) | |
| *H01L 29/423* | (2006.01) | |
| *H01L 29/49* | (2006.01) | |
| *H01L 21/8238* | (2006.01) | |
| *H01L 27/092* | (2006.01) | |
| *H01L 29/66* | (2006.01) | |
| *H01L 29/78* | (2006.01) | |
| *H01L 21/8234* | (2006.01) | |
| *H01L 27/088* | (2006.01) | |

(52) U.S. Cl.
CPC . *H01L 29/42372* (2013.01); *H01L 21/823842* (2013.01); *H01L 27/092* (2013.01); *H01L 29/4966* (2013.01); *H01L 29/66545* (2013.01); *H01L 29/66636* (2013.01); *H01L 29/78* (2013.01); *H01L 21/82345* (2013.01); *H01L 27/088* (2013.01)

(58) Field of Classification Search
CPC ................. H01L 21/82345; H01L 21/823842
See application file for complete search history.

(56) References Cited

U.S. PATENT DOCUMENTS

| | | | |
|---|---|---|---|
| 7,919,820 B2 | 4/2011 | Chung et al. | |
| 8,129,794 B2 | 3/2012 | Hirase | |
| 8,436,424 B2 | 5/2013 | Ikeda | |
| 8,637,390 B2 | 1/2014 | Ganguli et al. | |
| 2015/0126023 A1* | 5/2015 | Choi ................ | H01L 21/28158 438/591 |

FOREIGN PATENT DOCUMENTS

| | | |
|---|---|---|
| KR | 10-2013-0087482 | 8/2013 |
| WO | WO 2011/153095 | 12/2011 |

* cited by examiner

*Primary Examiner* — Daniel Whalen
(74) *Attorney, Agent, or Firm* — Muir Patent Law, PLLC

(57) ABSTRACT

Provided is a semiconductor device having mid-gap work function metal gate electrodes. The semiconductor device includes a plurality of gate patterns, and the gate patterns have different gate electrode metals from each other or different gate electrode metal thicknesses from each other.

16 Claims, 35 Drawing Sheets

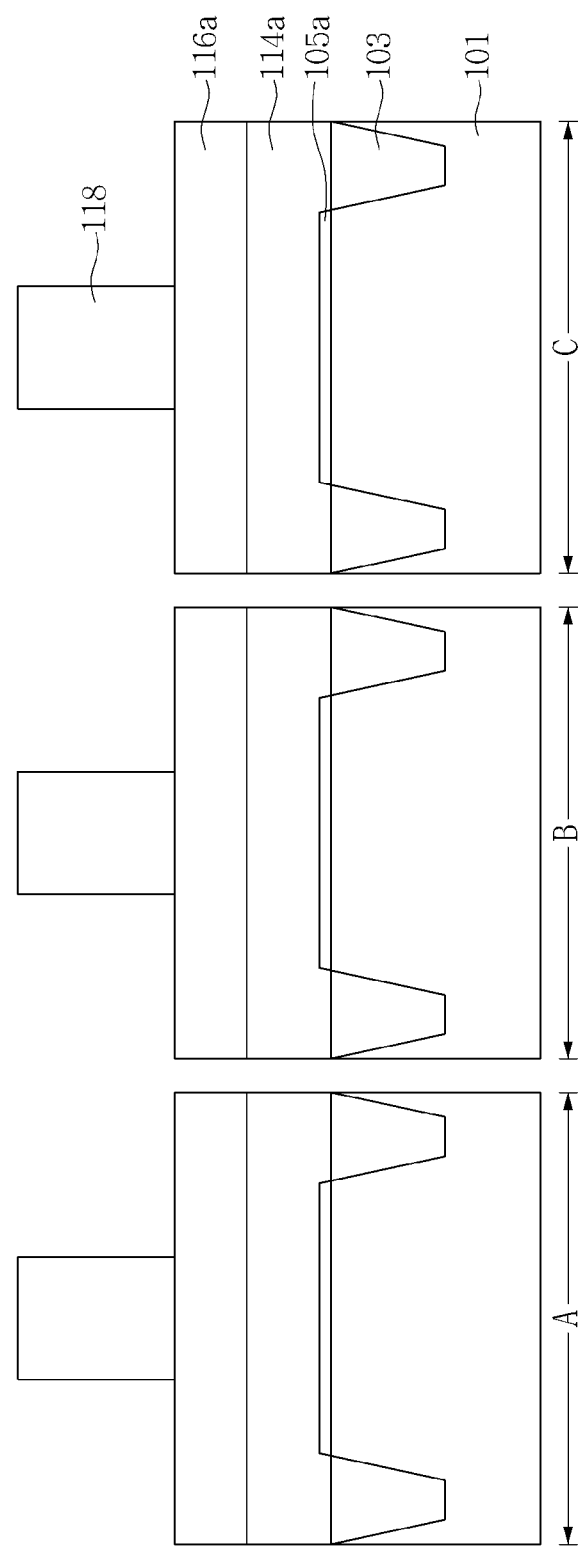

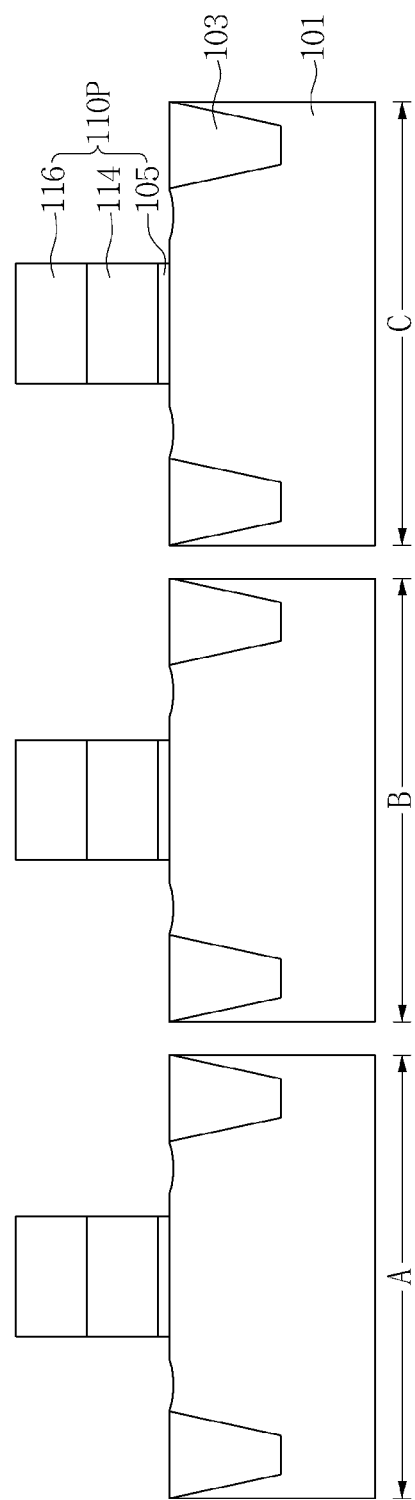

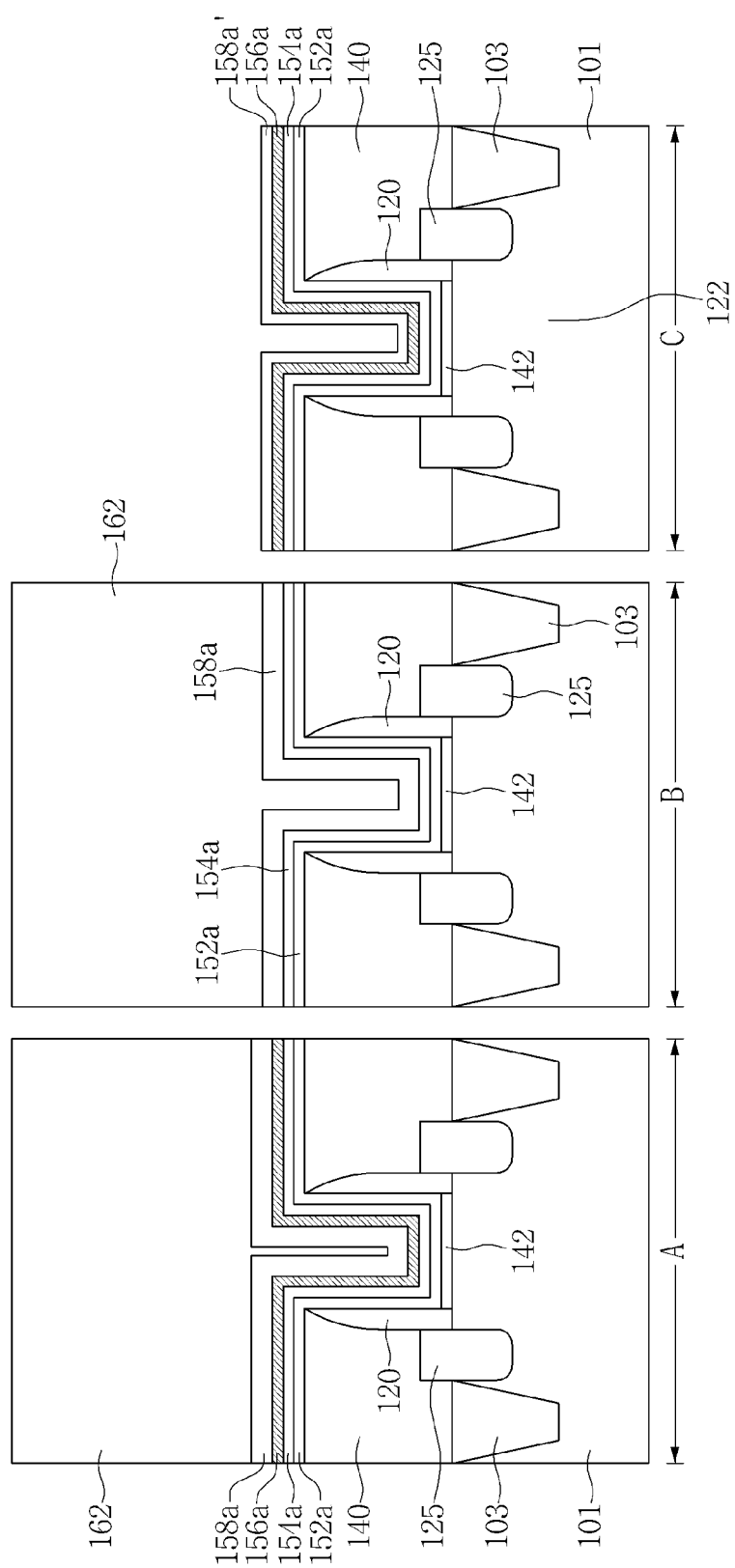

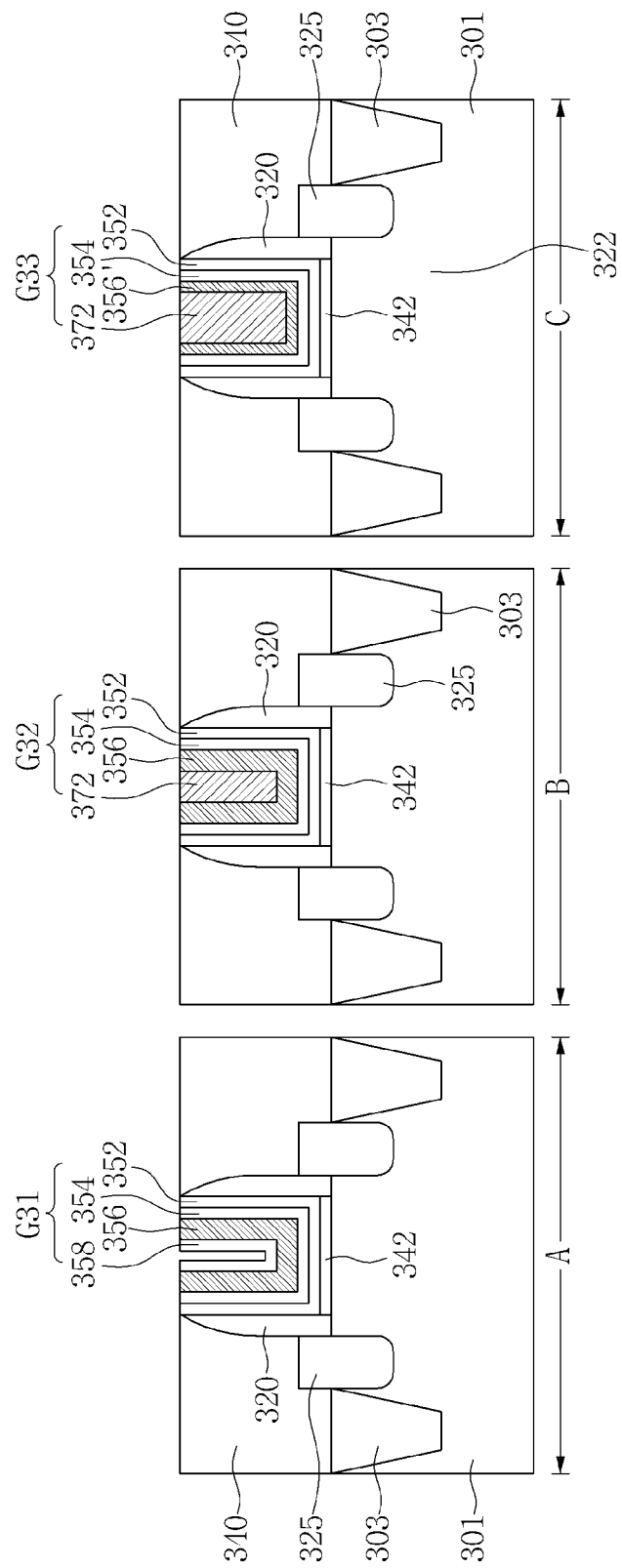

SEMICONDUCTOR DEVICE HAVING MID-GAP WORK FUNCTION METAL GATE ELECTRODE

CROSS-REFERENCE TO RELATED APPLICATION

This application claims priority under 35 U.S.C. §119 to Korean Patent Application No. 10-2014-0029052 filed on Mar. 12, 2014, the disclosure of which is hereby incorporated by reference in its entirety.

BACKGROUND

1. Field

The disclosed embodiments relate to a semiconductor device having a mid-gap work function metal gate electrode.

2. Description of Related Art

Conventional two dimensional and three dimensional transistors are implemented using differing work function metals when NMOS and PMOS transistors are classified. Furthermore, when the NMOS or PMOS transistors are the same types but have different threshold voltages from each other, the threshold voltages have been mostly adjusted by an ion implantation process without adjusting the work function metal.

SUMMARY

Embodiments of the inventive concept provide a semiconductor device having a FinFET.

Other embodiments of the inventive concept provide a semiconductor device in which gate electrodes of NMOS and PMOS transistors are formed of the same material.

Other embodiments of the inventive concept provide a semiconductor device in which gate electrodes of NMOS and PMOS transistors are formed of a mid-gap work function metal.

Other embodiments of the inventive concept provide a semiconductor device that includes the NMOS or PMOS transistors having different threshold voltages from each other by adjusting a thickness of a mid-gap work function metal.

The technical objectives of the inventive concept are not limited to the above disclosure; other objectives may become apparent to those of ordinary skill in the art based on the following descriptions.

In accordance with an embodiment of the inventive concept, a semiconductor device includes a first gate pattern, a second gate pattern, and a third gate pattern disposed on an active region of a substrate, wherein the first gate pattern includes a first gate insulating pattern formed on the active region of the substrate, a first gate dielectric pattern disposed on the first gate insulating pattern, a first gate barrier pattern disposed on the first gate dielectric pattern, a first metal disposed on the first gate barrier pattern, and a second metal disposed on the first metal, the second gate pattern includes a second gate insulating pattern formed on the active region of the substrate, a second gate dielectric pattern disposed on the second gate insulating pattern, a second gate barrier pattern disposed on the second gate dielectric pattern, the second metal disposed on the second gate barrier pattern, and a third metal disposed on the second metal, and the third gate pattern includes a third gate insulating pattern formed the active region of the substrate, a third gate dielectric pattern disposed on the third gate insulating pattern, a third gate barrier pattern disposed on the third gate dielectric pattern, the first metal disposed on the third gate barrier pattern, a fourth metal disposed on the first metal, and a fifth metal disposed on the fourth metal. The sum of thicknesses of the first metal and the second metal is greater than a thickness of the second metal, and the sum of thicknesses of the first metal and the fourth metal is smaller than the thickness of the second metal.

In accordance with an embodiment of the inventive concept, a semiconductor device include a first gate pattern, a second gate pattern, and a third gate pattern which are disposed on active regions of a substrate, source/drain regions located at both side surfaces of the active regions, lower interlayer insulating layers configured to surround side surfaces of the first to third gate patterns, etch-stop layers formed on upper surfaces of the first to third gate patterns and the lower interlayer insulating layers, and upper interlayer insulating layers formed on the etch-stop layers, wherein the first gate pattern includes a first gate insulating pattern formed on the active region of the substrate, a first gate dielectric pattern disposed on the first gate insulating pattern, a first gate barrier pattern disposed on the first gate dielectric pattern, a first metal directly formed on the first gate barrier pattern, and a second metal directly formed on the first metal, the second gate pattern includes a second gate insulating pattern formed on the active region of the substrate, a second gate dielectric pattern disposed on the second gate insulating pattern, a second gate barrier pattern disposed on the second gate dielectric pattern, the second metal directly formed on the second gate barrier pattern, and a third metal directly formed on the second metal, and the third gate pattern includes a third gate insulating pattern formed on the active region of the substrate, a third gate dielectric pattern disposed on the third gate insulating pattern, a third gate barrier pattern disposed on the third gate dielectric pattern, the first metal directly formed on the third gate barrier pattern, a fourth metal directly formed on the first metal, and a fifth metal directly formed on the fourth metal. The sum of thicknesses of the first metal and the second metal is greater than a thickness of the second metal, and the sum of thicknesses of the first metal and the fourth metal is smaller than the thickness of the second metal.

BRIEF DESCRIPTION OF THE DRAWINGS

The foregoing and other features and advantages of the inventive concepts will be apparent from the more particular description of various embodiments of the inventive concepts, as illustrated in the accompanying drawings in which like reference characters refer to the same or similar parts throughout the different views. The drawings are not necessarily to scale, emphasis instead being placed upon illustrating the principles of the inventive concepts. In the drawings:

FIGS. 4A to 4F are longitudinal sectional views for describing a method of fabricating the semiconductor device in accordance with still another embodiment of the inventive concept;

DETAILED DESCRIPTION OF THE EMBODIMENTS

Figure 1A:
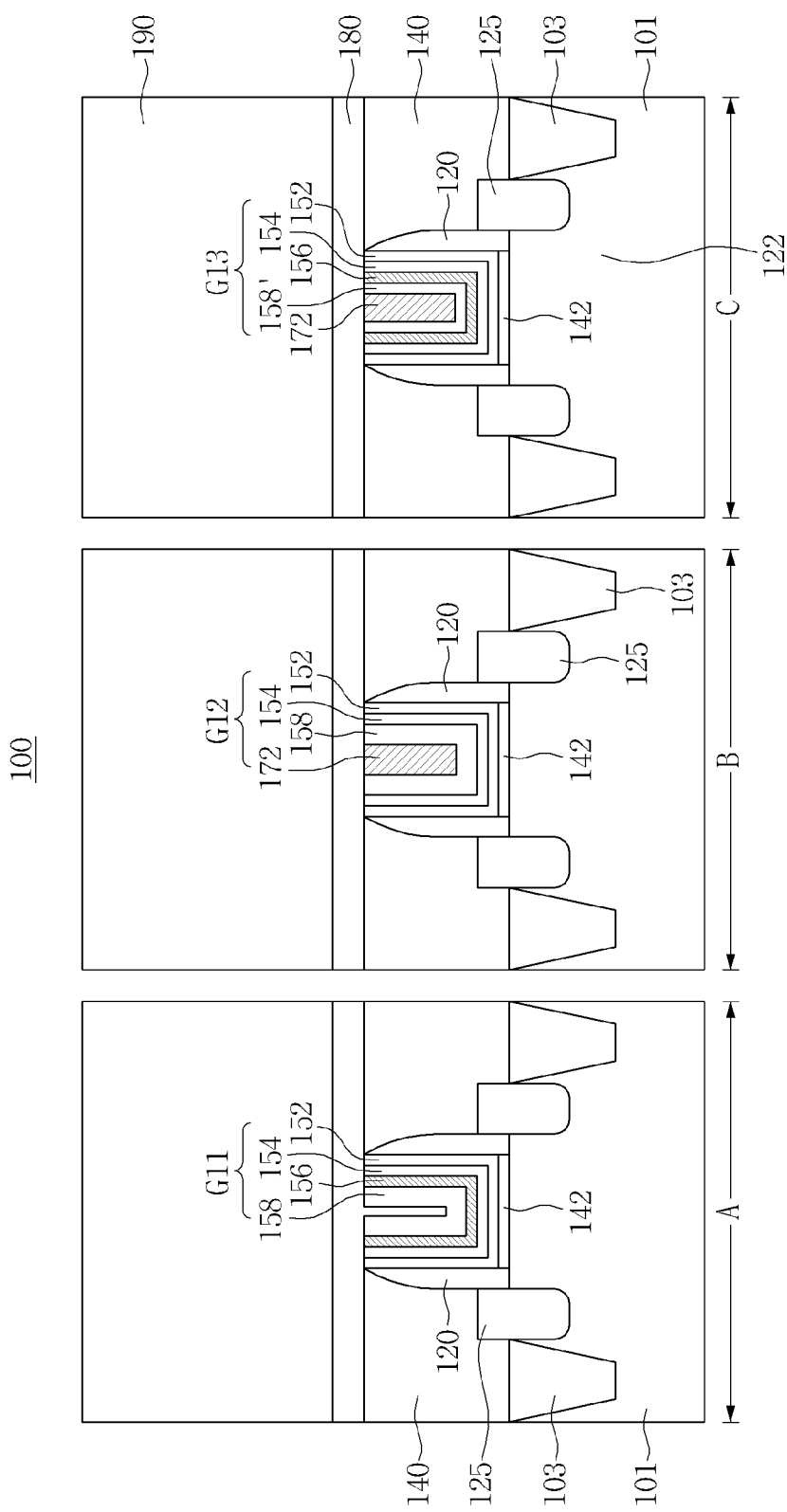
FIG. 1A is a longitudinal sectional view of a semiconductor device in accordance with an embodiment of the inventive concept.

Various embodiments will now be described more fully with reference to the accompanying drawings in which some embodiments are shown. These inventive concepts may, however, be embodied in different forms and should not be construed as limited to the embodiments set forth herein. In the drawings, the sizes and relative sizes of layers and regions may be exaggerated for clarity.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, or as "contacting" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A is a longitudinal sectional view of a semiconductor device in accordance with an embodiment of the inventive concept.

As used herein, a semiconductor device may refer to any of the various devices such as shown in FIGS. 1A-4F, and may also refer, for example, to one or more transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Referring to FIG. 1A, the semiconductor device 100 according to one embodiment of the inventive concept may include device isolation regions 103, active regions 122 and source/drain regions 125 in a substrate 101, and gate patterns G11, G12 and G13, gate spacers 120, a lower interlayer insulating layer 140, and an upper interlayer insulating layer 190 on the substrate 101.

On the substrate 101, a region A is a region to form low-Vt PMOS and super low-Vt PMOS transistors, a region B is a region to form high-Vt NMOS and high-Vt PMOS transistors, a region C is a region to form low-Vt NMOS and super low-Vt NMOS transistors.

The substrate 101 may include, for example, a bulk single-crystalline silicon wafer.

The substrate 101 may have the device isolation regions 103 which define the active regions 122.

The gate patterns G11, G12 and G13 may be formed on the active regions 122. The gate pattern G11 on the region A may include a gate insulating pattern 142, a gate dielectric pattern 152, a gate barrier pattern 154, a lower gate electrode 156, and a middle gate electrode 158. The gate pattern G12 on the region B may include the gate insulating pattern 142, the gate dielectric pattern 152, the gate barrier pattern 154, the middle gate electrode 158, and an upper gate electrode 172. The gate pattern G13 on the region C may include the gate insulating pattern 142, the gate dielectric pattern 152, the gate barrier pattern 154, the lower gate electrode 156, a thin middle gate electrode 158', and the upper gate electrode 172.

The gate insulating patterns 142 may be directly formed on the active regions 122. A longitudinal section of the gate insulating pattern 142 may have a horizontal bar shape. The gate insulating patterns 142 may include thermally oxidized silicon. For example, the gate insulating patterns 142 may be oxidized and formed on a surface of the substrate 101 by a thermal oxidizing process.

The gate dielectric patterns 152 may be formed on the gate insulating patterns 142. A longitudinal section of the gate dielectric pattern 152 may have a U-shape. For example, outer surfaces of the gate dielectric patterns 152 may be in contact with inner surfaces of the gate spacers 120. The gate dielectric patterns 152 may include high dielectric insulating materials such as hafnium oxide (HfO), zirconium oxide (ZrO), or other metal oxides.

The gate barrier patterns 154 may be formed on the gate dielectric patterns 152. A longitudinal section of the gate barrier pattern 154 may have a U-shape. For example, outer surfaces of the gate barrier patterns 154 may be in contact with inner surfaces of the gate dielectric patterns 152. The gate barrier patterns 154 may include a metal for barrier such as titanium (Ti), titanium nitride (TiN), tantalum (Ta), or tantalum nitride (TaN).

The lower gate electrodes 156 may be formed on the gate barrier patterns 154. A longitudinal section of the lower gate electrode 156 may have a U-shape. For example, outer surfaces of the lower gate electrodes 156 may be in contact with inner surfaces of the gate barrier patterns 154. In one embodiment, the lower gate electrodes 156 may include a mid-gap work function metal. The lower gate electrodes 156 may include a metal multilayer, a metal alloy layer and/or metal compound layers. For example, the lower gate electrodes 156 may include a metal such as titanium nitride (TiN), tantalum nitride (TaN), cobalt (Co), titanium aluminum (TiAl), titanium aluminum carbide (TiAlC), or lanthanum oxide (La2O3).

The middle gate electrodes 158 may be formed on the lower gate electrode 156 in the region A and on the gate barrier pattern 154 in the region B. A longitudinal section of the middle gate electrode 158 may have a U-shape. The lower gate electrode 156 may surround side and bottom surfaces of the middle gate electrode 158 on the region A. The gate barrier pattern 154 may surround the side and bottom surfaces of the middle gate electrode 158 on the region B. The middle gate electrodes 158 may include a mid-gap work function metal. The middle gate electrodes 158 may include a metal multilayer, a metal alloy layer and/or metal compound layers. For example, the middle gate electrodes 158 may include a metal such as titanium nitride (TiN), tantalum nitride (TaN), cobalt (Co), titanium aluminum (TiAl), titanium aluminum carbide (TiAlC), or lanthanum oxide (La2O3). The middle gate electrodes 158 may be formed to have thicknesses greater than the lower gate electrodes 156.

The thin middle gate electrode 158' may be formed on the lower gate electrode 156 in the region C. The lower gate electrode 156 may surround side and bottom surfaces of the thin middle gate electrode 158'. The thin middle gate electrode 158' may be formed, for example, of the same material as the middle gate electrodes 158. In one embodiment, the thin middle gate electrode 158' may have a thickness smaller than the middle gate electrodes 158 in the region A and the region B.

The upper gate electrodes 172 may be formed on the middle gate electrode 158 in the region B and the thin middle gate electrode 158' in the region C. A longitudinal section of the upper gate electrode 172 may have a vertical bar shape. The middle gate electrode 158 may surround side and bottom surfaces of the upper gate electrode 172 in the region B, and the thin middle gate electrode 158' may surround the side and bottom surfaces of the upper gate electrode 172 in the region C. The upper gate electrode 172 may include a metal having high conductivity, such as tungsten (W) or copper (Cu).

The sum of the thicknesses of the lower gate electrode 156 and the middle gate electrode 158 on the region A may be formed to be greater than a thickness of the middle gate electrode 158 on the region B, and the sum of the thicknesses of the lower gate electrode 156 and the thin middle gate electrode 158' on the region C may be formed to be smaller than the thickness of middle gate electrode 158 on the region B.

The gate spacers 120 may be formed on the outer surfaces of both the gate insulating patterns 142 and the gate dielectric patterns 152. The gate spacers 120 may be located between the gate patterns G11, G12 and G13 and the source/drain regions 125 in a horizontal level. The inner surfaces of the gate spacers 120 may be in contact with the outer surfaces of the gate dielectric patterns 152. Outer ends of the gate spacers 120 may be in contact with inner ends of the source/drain regions 125. The gate spacers 120 may include silicon nitride.

The source/drain regions 125 may be formed on the active regions 122. The source/drain regions 125 may be materially discontinued with the substrate 101 and the active regions 122. For example, the source/drain regions 125 may include epitaxial-grown SiGe. Upper surfaces of the source/drain regions 125 may be located at higher levels than those of the active regions 122. The source/drain regions 125 may provide sources or drains. For example, one transistor may be formed to have the active region 122, the gate patterns G11, G12 and G13 and the source/drain regions 125 located at both side surfaces of the active region 122.

The lower interlayer insulating layer 140 may cover the device isolation regions 103 and the source/drain regions 125, and surround side surfaces of the gate pattern G11, G12 and G13. The lower interlayer insulating layer 140 may have the same upper surface as the gate patterns G11, G12 and G13. The lower interlayer insulating layer 140 may include, for example, silicon oxide.

The etch-stop layer 180 may be formed on upper surfaces of the gate patterns G11, G12 and G13 and the lower interlayer insulating layer 140. The etch-stop layer 180 may include silicon nitride.

The upper interlayer insulating layer 190 may be formed on the etch-stop layer 180. The upper interlayer insulating layer 190 may include silicon oxide.

The semiconductor device 100 according to an embodiment of the inventive concept may be formed of the same material as gate electrodes of NMOS and PMOS transistors using the mid-gap work function metal. Accordingly, the cost of fabricating the semiconductor device 100 may be reduced.

In the semiconductor device 100 according to an embodiment of the inventive concept, since high-Vt NMOS, low-Vt NMOS and super low-Vt NMOS transistors, which are same types, or high-Vt PMOS, low-Vt PMOS and super low-Vt PMOS transistors, which are same types, are classified by the thickness of the mid-gap work function metal, electric characteristics of transistors may be improved.

In the semiconductor device 100 according to an embodiment of the inventive concept, since high-Vt PMOS and high-Vt NMOS transistors are classified by the mid-gap work function metal instead of an ion implantation process, characteristics of local mismatch occurring from the ion implantation process may be improved.

Figure 1B:
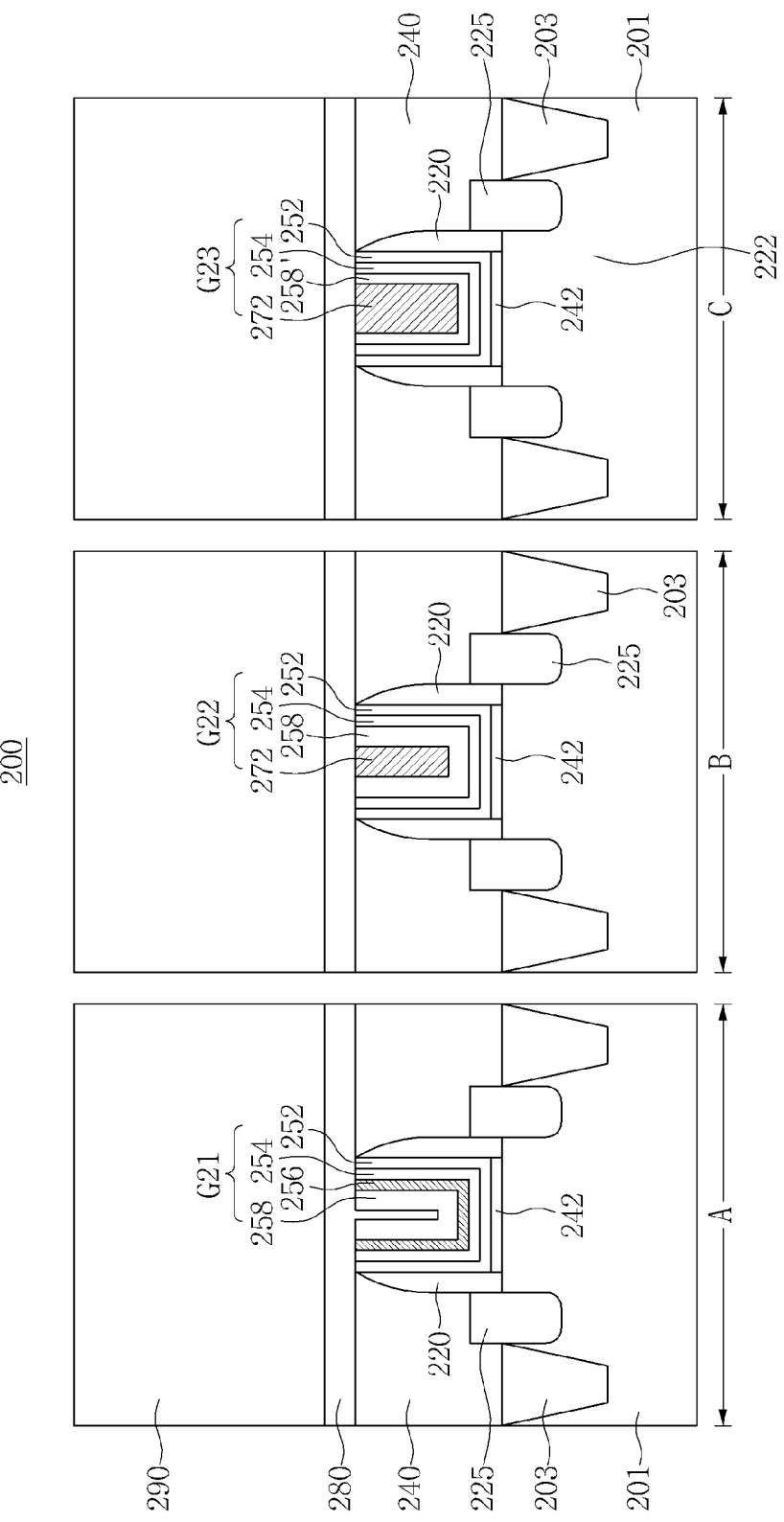
FIG. 1B is a longitudinal sectional view of a semiconductor device in accordance with another embodiment of the inventive concept.

FIG. 1B is a longitudinal sectional view of a semiconductor device in accordance with another embodiment of the inventive concept.

Referring to FIG. 1B, the semiconductor device 200 according to another embodiment of the inventive concept may include gate patterns G21, G22, G23 on a substrate 201.

The gate patterns G21, G22 and G23 may be formed on active regions 222. The gate pattern G21 on the region A may include a gate insulating pattern 242, a gate dielectric pattern 252, a gate barrier pattern 254, a lower gate electrode 256, and a middle gate electrode 258. The gate pattern G22 on the region B may include the gate insulating pattern 242, the gate dielectric pattern 252, the gate barrier pattern 254, the middle gate electrode 258, and an upper gate electrode 272. The gate pattern G23 on the region C may include the gate insulating pattern 242, the gate dielectric pattern 252, the gate barrier pattern 254, a thin middle gate electrode 258', and the upper gate electrode 272.

The gate insulating patterns 242 may be directly formed on the active regions 222. A longitudinal section of the gate insulating pattern 242 may have a horizontal bar shape. The gate insulating patterns 242 may include thermally oxidized silicon. For example, the gate insulating patterns 242 may be oxidized and formed on a surface of the substrate 201 by a thermal oxidizing process.

The gate dielectric patterns 252 may be formed on the gate insulating patterns 242. A longitudinal section of the gate dielectric pattern 252 may have a U-shape. For example, the outer surfaces of the gate dielectric patterns 252 may be in contact with the inner surfaces of gate spacers 220. The gate dielectric patterns 252 may include high dielectric insulating materials such as hafnium oxide (HfO), zirconium oxide (ZrO), or other metal oxides.

The gate barrier patterns 254 may be formed on the gate dielectric patterns 252. A longitudinal section of the gate barrier pattern 254 may have a U-shape. For example, outer surfaces of the gate barrier patterns 254 may be in contact with the inner surfaces of the gate dielectric patterns 252.

The gate barrier patterns 254 may include a metal for a barrier, such as titanium (Ti), titanium nitride (TiN), tantalum (Ta), or tantalum nitride (TaN).

The lower gate electrodes 256 may be formed on the gate barrier patterns 254. A longitudinal section of the lower gate electrode 256 may have a U-shape. For example, the outer surfaces of the lower gate electrodes 256 may be in contact with the inner surfaces of the gate barrier patterns 254. The lower gate electrodes 256 may include a mid-gap work function metal. The lower gate electrodes 256 may include a metal multilayer, a metal alloy layer and/or metal compound layers. For example, the lower gate electrodes 256 may include a metal such as titanium nitride (TiN), tantalum nitride (TaN), cobalt (Co), titanium aluminum (TiAl), titanium aluminum carbide (TiAlC), or lanthanum oxide (La2O3).

The middle gate electrodes 258 may be formed on the lower gate electrode 256 in the region A and the gate barrier pattern 254 in the region B. The lower gate electrode 256 may surround side and bottom surfaces of the middle gate electrode 258 on the region A. The gate barrier pattern 254 may surround the side and bottom surfaces of the middle gate electrode 258 on the region B. The middle gate electrodes 258 may include a mid-gap work function metal. The middle gate electrodes 258 may include a metal multilayer, a metal alloy layer and/or metal compound layers. For example, the middle gate electrodes 258 may include a metal such as titanium nitride (TiN), tantalum nitride (TaN), cobalt (Co), titanium aluminum (TiAl), titanium aluminum carbide (TiAlC), or lanthanum oxide (La2O3).

The thin middle gate electrode 258' may be formed on the gate barrier pattern 254 in the region C. The gate barrier pattern 254 may surround side and bottom surfaces of the thin middle gate electrode 258'. The thin middle gate electrode 258' may be formed of the same material as the middle gate electrodes 258. The thin middle gate electrode 258' may have a thickness smaller than the middle gate electrodes 258 in the region A and the region B.

The upper gate electrodes 272 may be formed on the middle gate electrode 258 in the region B and the thin middle gate electrode 258' in the region C. The middle gate electrode 258 may surround side and bottom surfaces of the upper gate electrode 272 in the region B, and the thin middle gate electrode 258' may surround the side and bottom surfaces of the upper gate electrode 272 in the region C. The upper gate electrode 272 may include a metal having high conductivity, such as tungsten (W) or copper (Cu).

The sum of the thicknesses of the lower gate electrode 256 and the middle gate electrode 258 on the region A may be formed to be greater than a thickness of the middle gate electrode 258 on the region B, and a thickness of the thin middle gate electrode 258' on the region C may be formed to be smaller than that of middle gate electrode 258 on the region B.

Figure 1C:
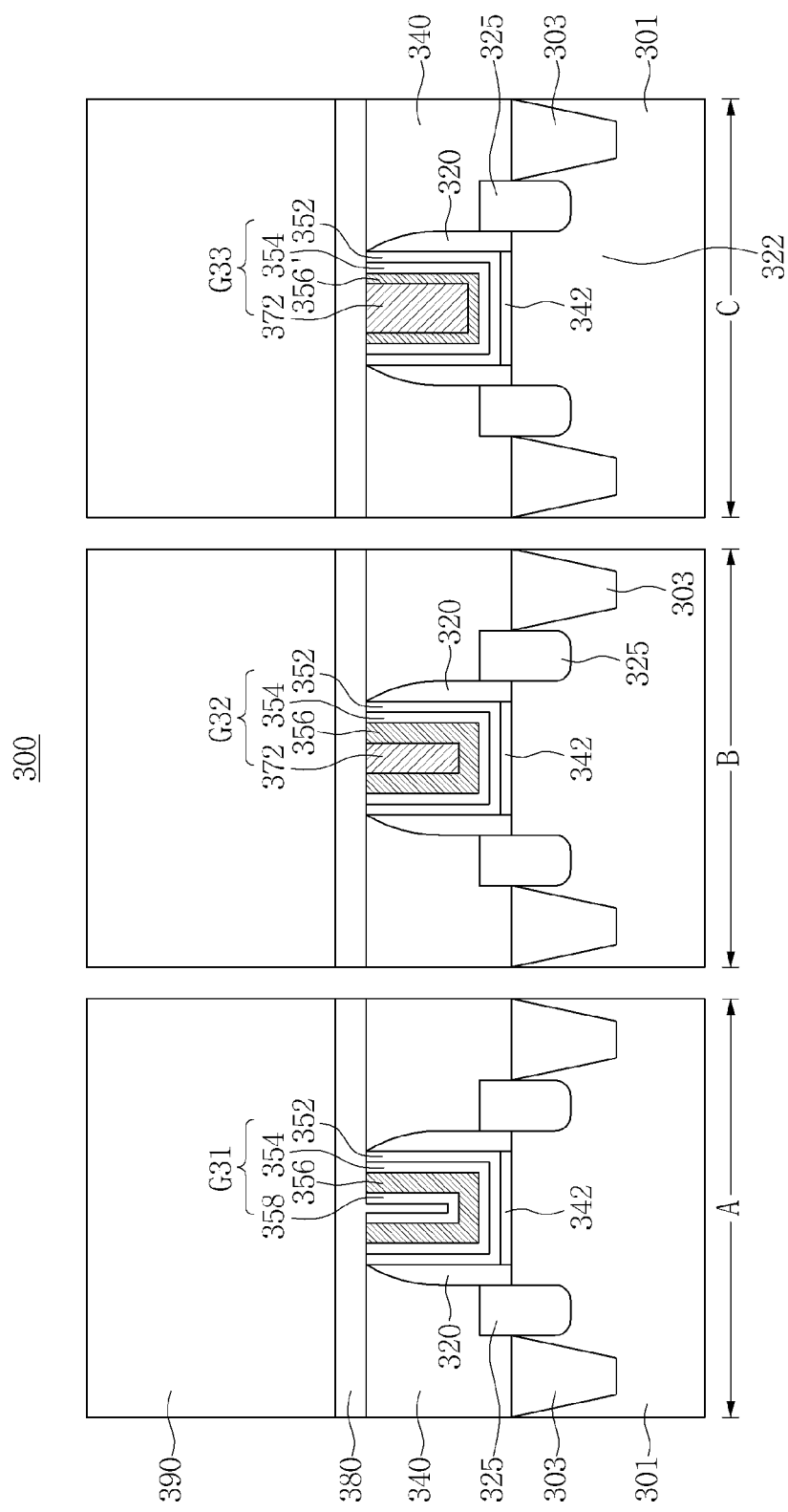
FIG. 1C is a longitudinal sectional view of a semiconductor device in accordance with still another embodiment of the inventive concept.

FIG. 1C is a longitudinal sectional view of a semiconductor device in accordance with still another embodiment of the inventive concept.

Referring to FIG. 1C, the semiconductor device 300 according to one embodiment of the inventive concept may include gate patterns G31, G32 and G33 on a substrate 301.

The gate patterns G31, G32 and G33 may be formed on active regions 322. The gate pattern G31 on the region A may include a gate insulating pattern 342, a gate dielectric pattern 352, a gate barrier pattern 354, a lower gate electrode 356, and a middle gate electrode 358. The gate pattern G32 on the region B may include the gate insulating pattern 342, the gate dielectric pattern 352, the gate barrier pattern 354, the lower gate electrode 356, and an upper gate electrode 372. The gate pattern G33 on the region C may include the gate insulating pattern 342, the gate dielectric pattern 352, the gate barrier pattern 354, a thin lower gate electrode 356', and the upper gate electrode 372.

The gate insulating patterns 342 may be directly formed on the active regions 322. A longitudinal section of the gate insulating pattern 342 may have a horizontal bar shape. The gate insulating patterns 342 may include thermally oxidized silicon. For example, the gate insulating patterns 342 may be oxidized and formed on a surface of the substrate 301 by a thermal oxidizing process.

The gate dielectric patterns 352 may be formed on the gate insulating patterns 342. A longitudinal section of the gate dielectric pattern 352 may have a U-shape. For example, the outer surfaces of the gate dielectric patterns 352 may be in contact with the inner surfaces of gate spacers 320. The gate dielectric patterns 352 may include high dielectric insulating materials such as hafnium oxide (HfO), zirconium oxide (ZrO), or other metal oxides.

The gate barrier patterns 354 may be formed on the gate dielectric patterns 352. A longitudinal section of the gate barrier pattern 354 may have a U-shape. For example, the outer surfaces of the gate barrier pattern 354 may be in contact with the inner surfaces of the gate dielectric patterns 352. The gate barrier patterns 354 may include a metal for barrier, such as titanium (Ti), titanium nitride (TiN), tantalum (Ta), or tantalum nitride (TaN).

The lower gate electrodes 356 may be formed on the gate barrier patterns 354. A longitudinal section of the lower gate electrode 356 may have a U-shape. For example, the outer surfaces of the lower gate electrodes 356 may be in contact with inner surfaces of the gate barrier patterns 354. The lower gate electrodes 356 may include a mid-gap work function metal. The lower gate electrodes 356 may include metal multilayer, a metal alloy layer and/or metal compound layers. For example, the lower gate electrodes 356 may include a metal such as titanium nitride (TiN), tantalum nitride (TaN), cobalt (Co), titanium aluminum (TiAl), titanium aluminum carbide (TiAlC), or lanthanum oxide (La2O3).

The thin lower gate electrode 356' may be formed on the gate barrier pattern 354 in the region C. The gate barrier pattern 354 may surround side and bottom surfaces of the thin lower gate electrode 356'. The thin lower gate electrode 356' may be formed of the same material as the lower gate electrode 356. The thin lower gate electrode 356' may have a thickness smaller than the lower gate electrodes 356 in the region A and the region B.

The middle gate electrode 358 may be formed on the lower gate electrode 356 in the region A. The lower gate electrode 356 may surround side and bottom surfaces of the middle gate electrode 358 on the region A. The middle gate electrode 358 may include a mid-gap work function metal. The middle gate electrode 358 may include a metal multilayer, a metal alloy layer and/or metal compound layers. For example, the middle gate electrode 358 may include a metal such as titanium nitride (TiN), tantalum nitride (TaN), cobalt (Co), titanium aluminum (TiAl), titanium aluminum carbide (TiAlC), or lanthanum oxide (La2O3).

The upper gate electrodes 372 may be formed on the lower gate electrode 356 in the region B and the thin lower gate electrode 356' in the region C. The lower gate electrode 356 may surround side and bottom surfaces of the upper gate electrode 372 in the region B, and the thin lower gate electrode 356' may surround the side and bottom surfaces of the upper gate electrode 372 in the region C. The upper gate electrodes 372 may include metal having high conductivity, such as tungsten (W) or copper (Cu).

The sum of the thicknesses of the lower gate electrode 356 and the middle gate electrode 358 on the region A may be formed to be greater than a thickness of the lower gate electrode 356 on the region B, and a thickness of the thin lower gate electrode 356' on the region C may be formed to be smaller than that of lower gate electrode 356 on the region B.

Figure 2A:
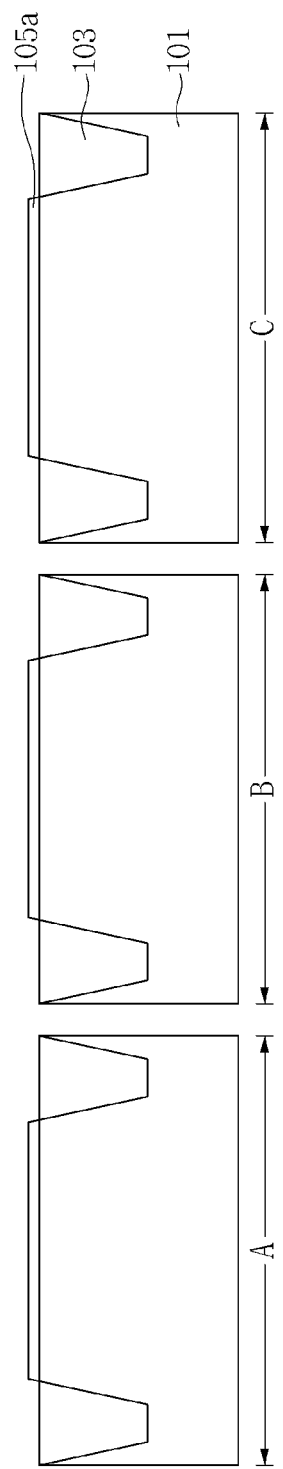
FIGS. 2A to 2Q are longitudinal sectional views for describing a method of fabricating the semiconductor device in accordance with an embodiment of the inventive concept.
Figure 2D:
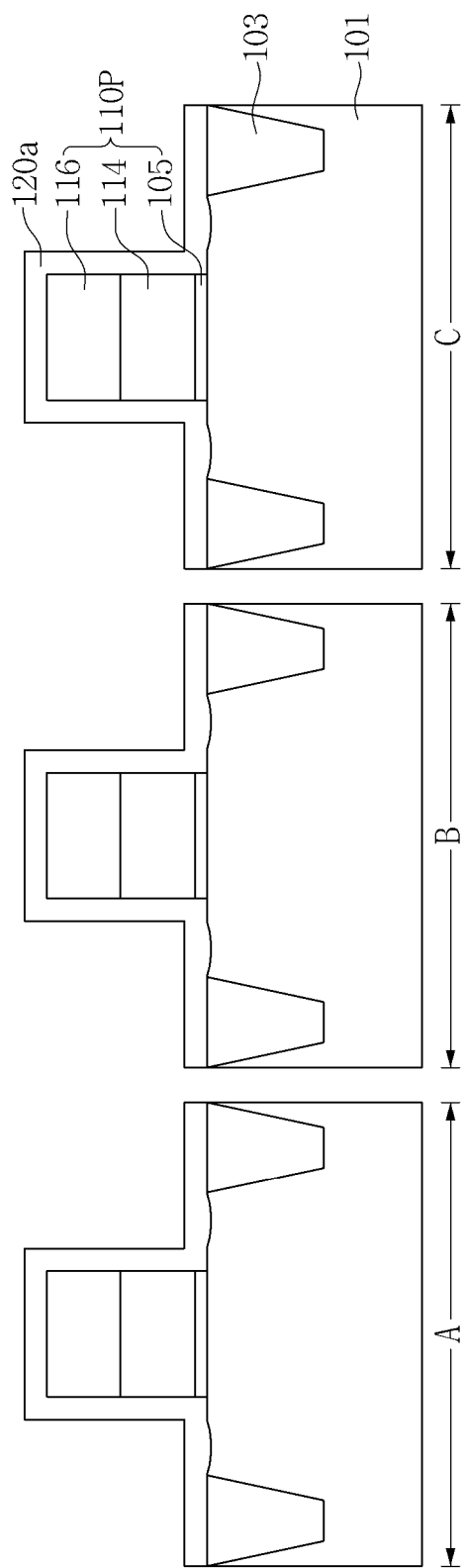
Figure 2E:
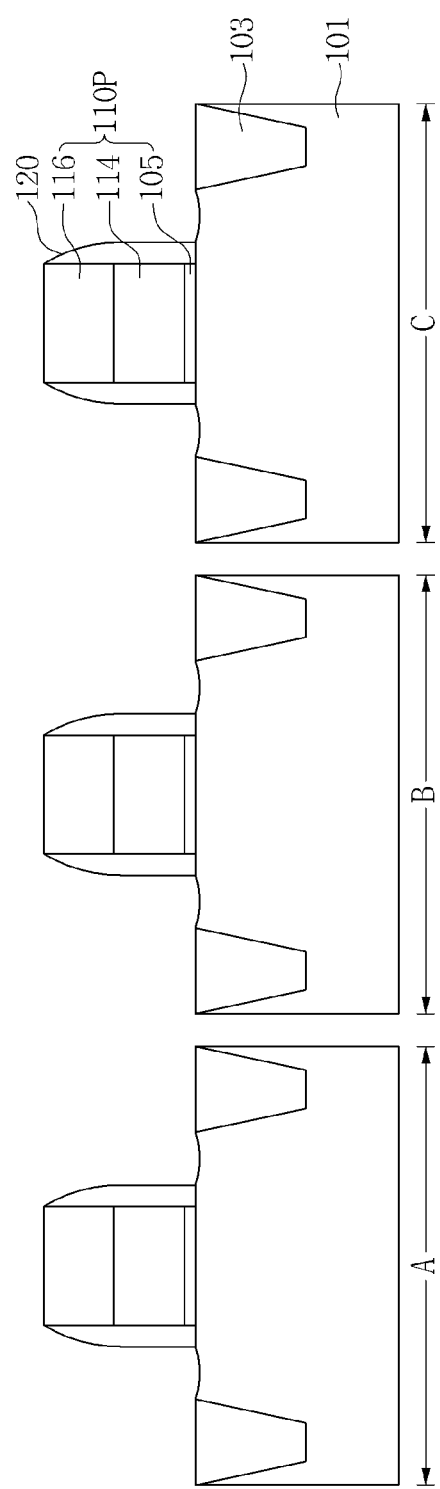
Figure 2F:
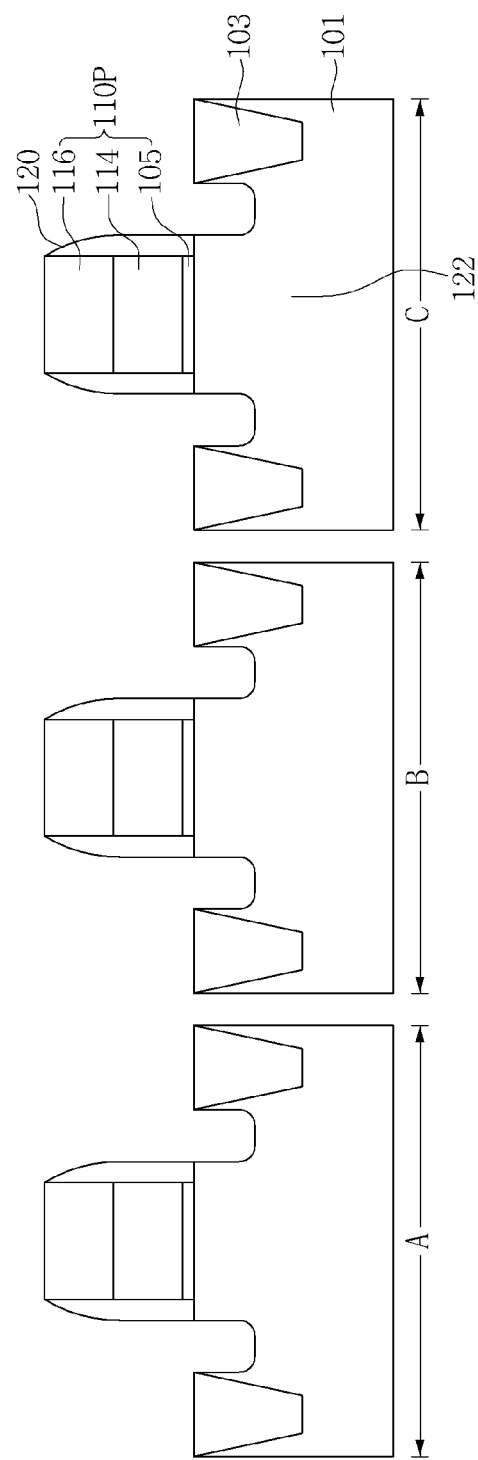
Figure 2G:
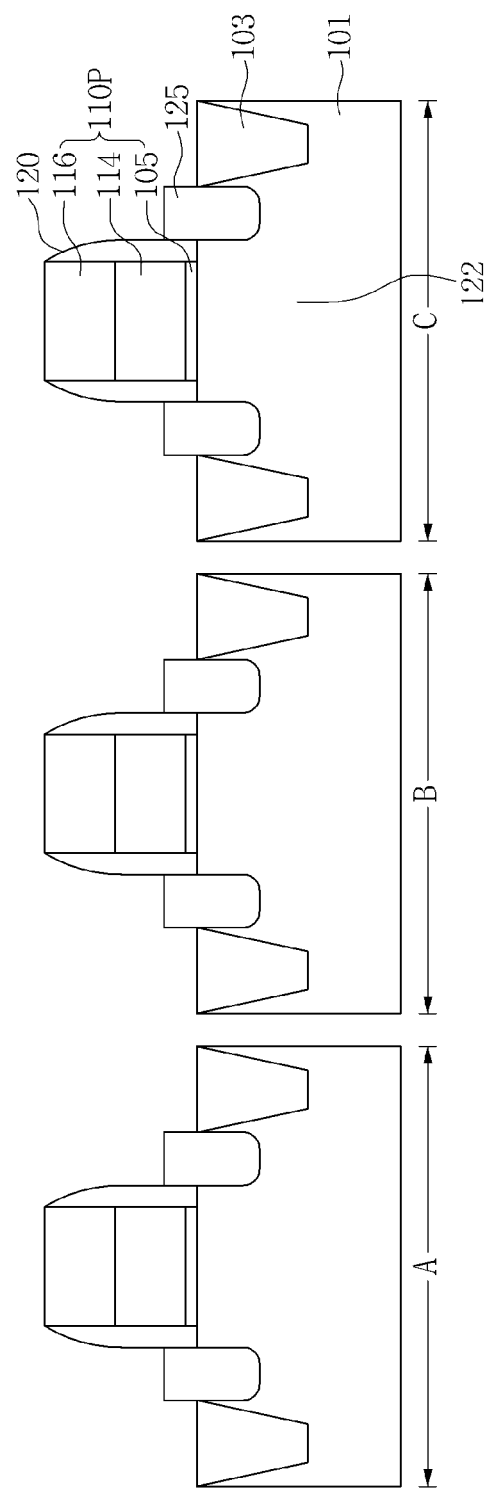
Figure 2H:
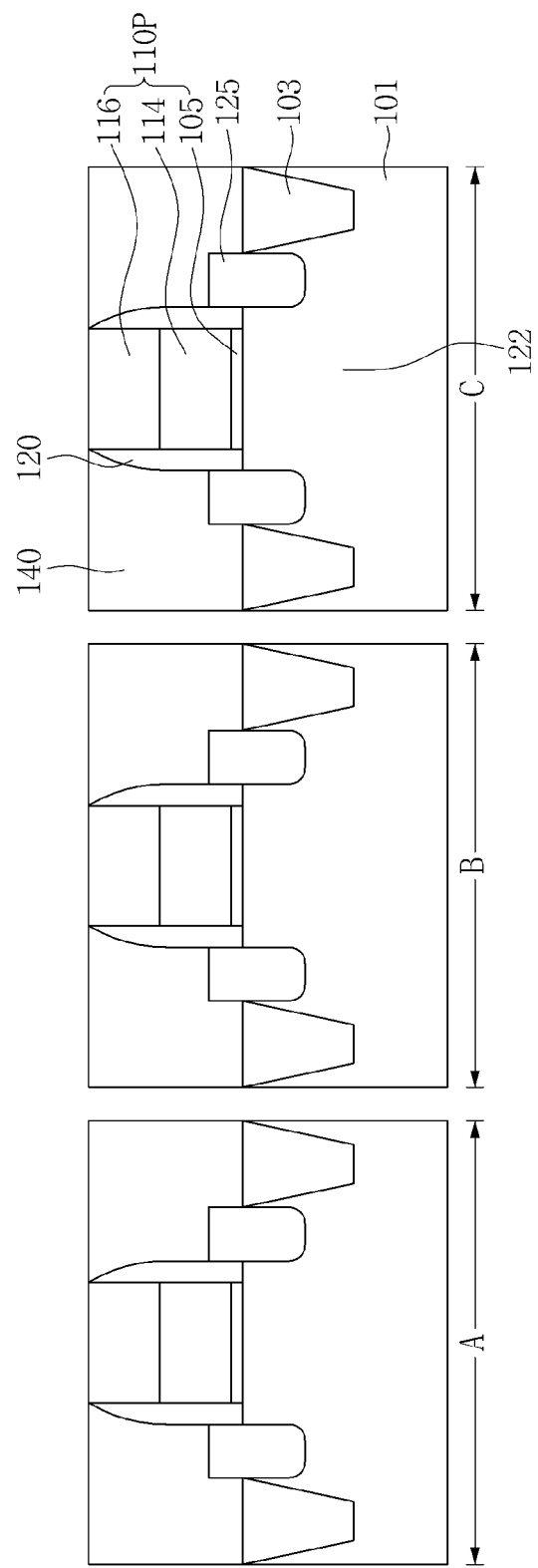
Figure 2I:
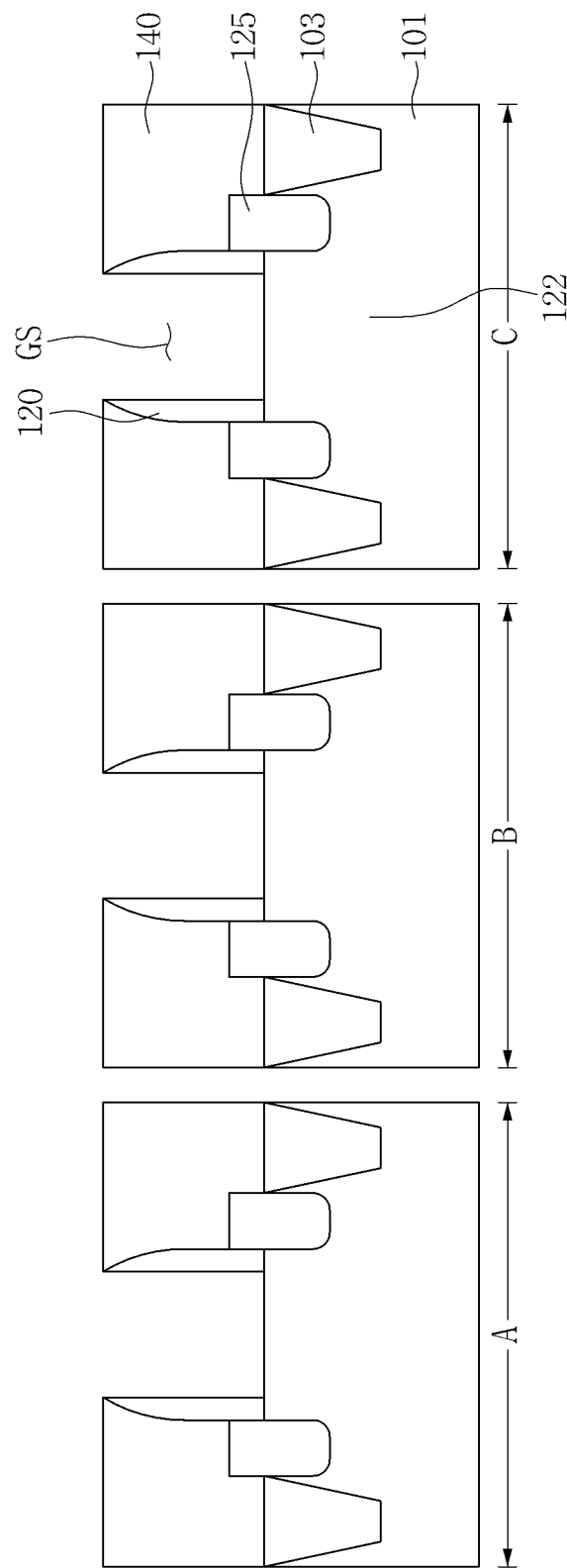
Figure 2J:
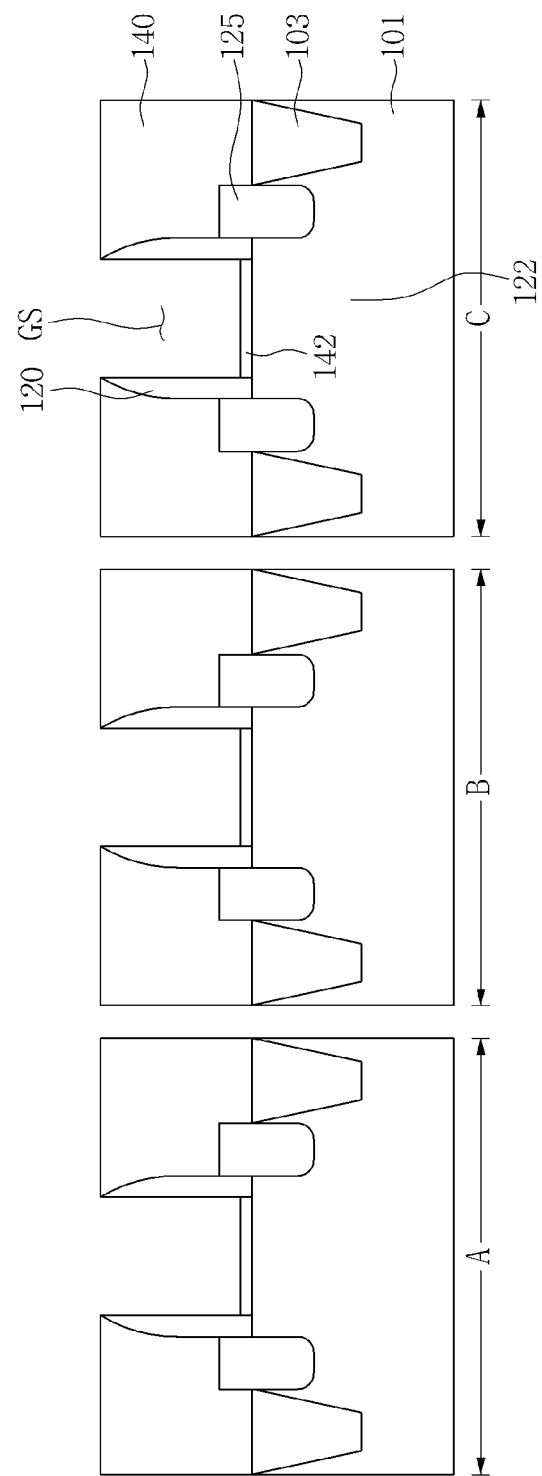
Figure 2K:
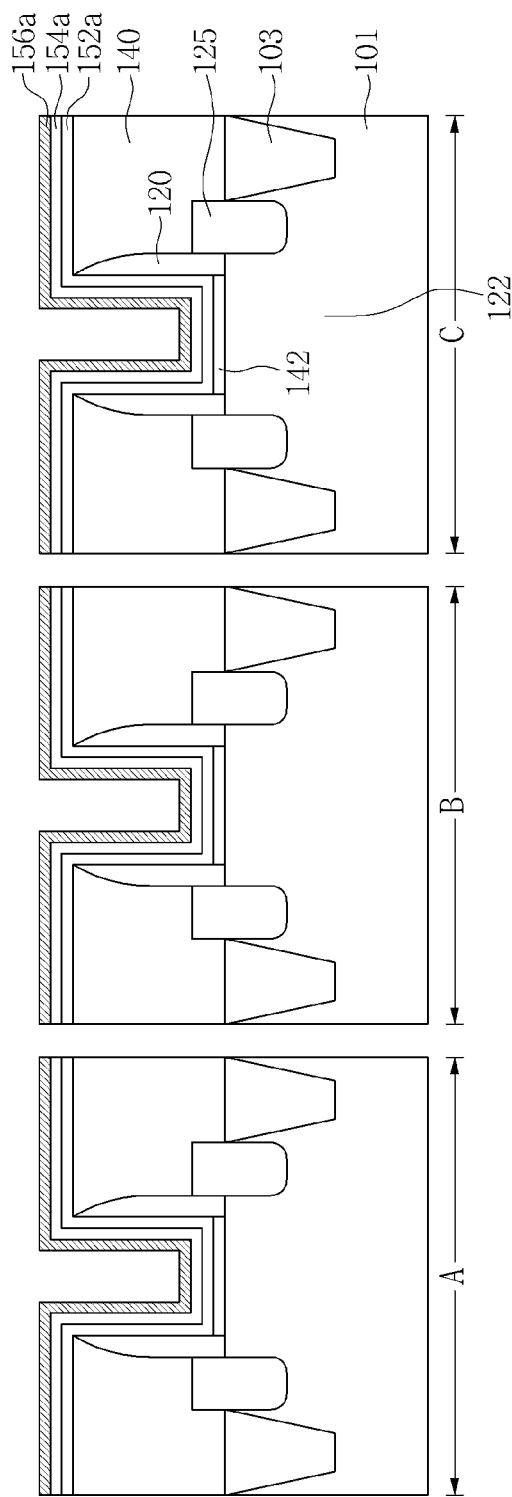
Figure 2L:
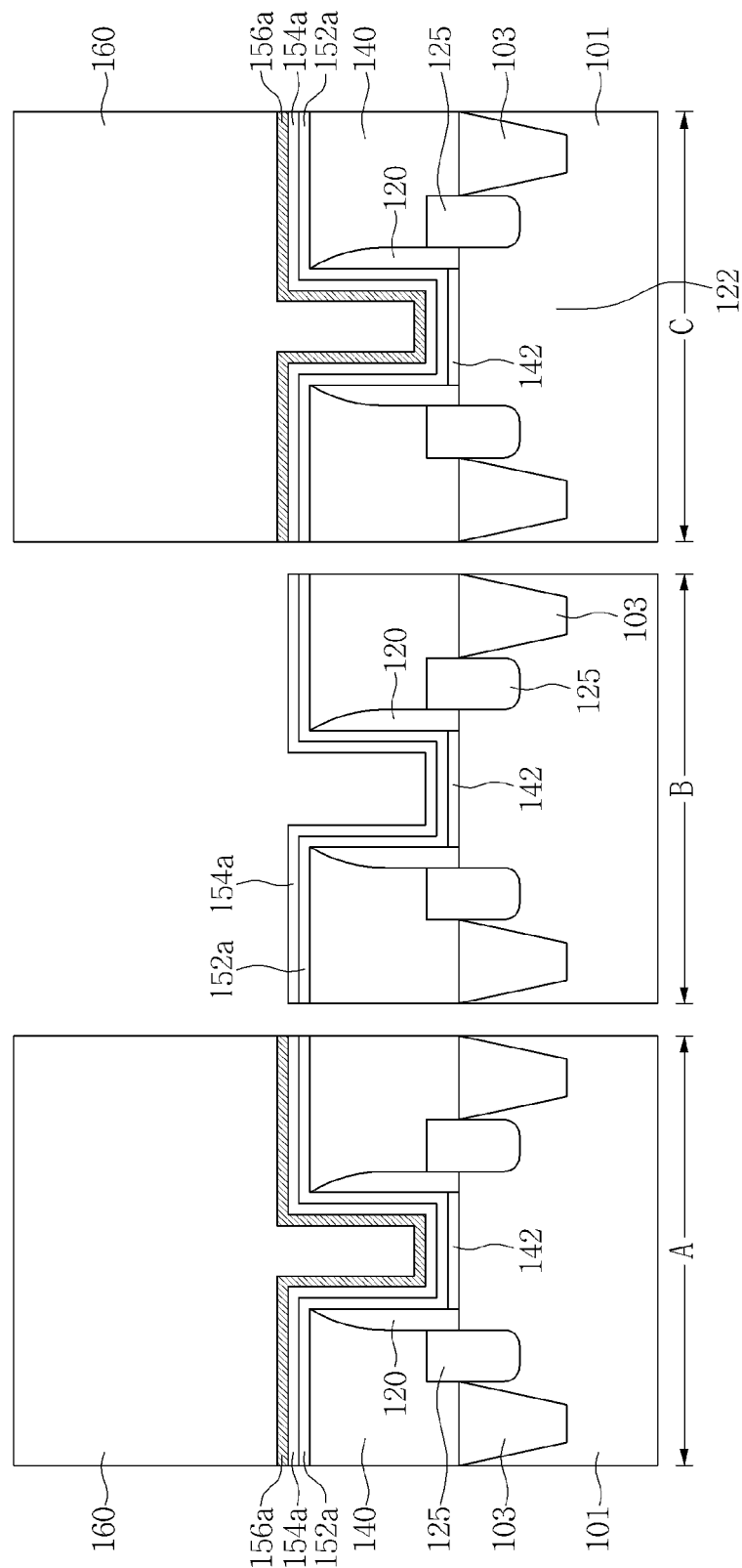
Figure 2M:
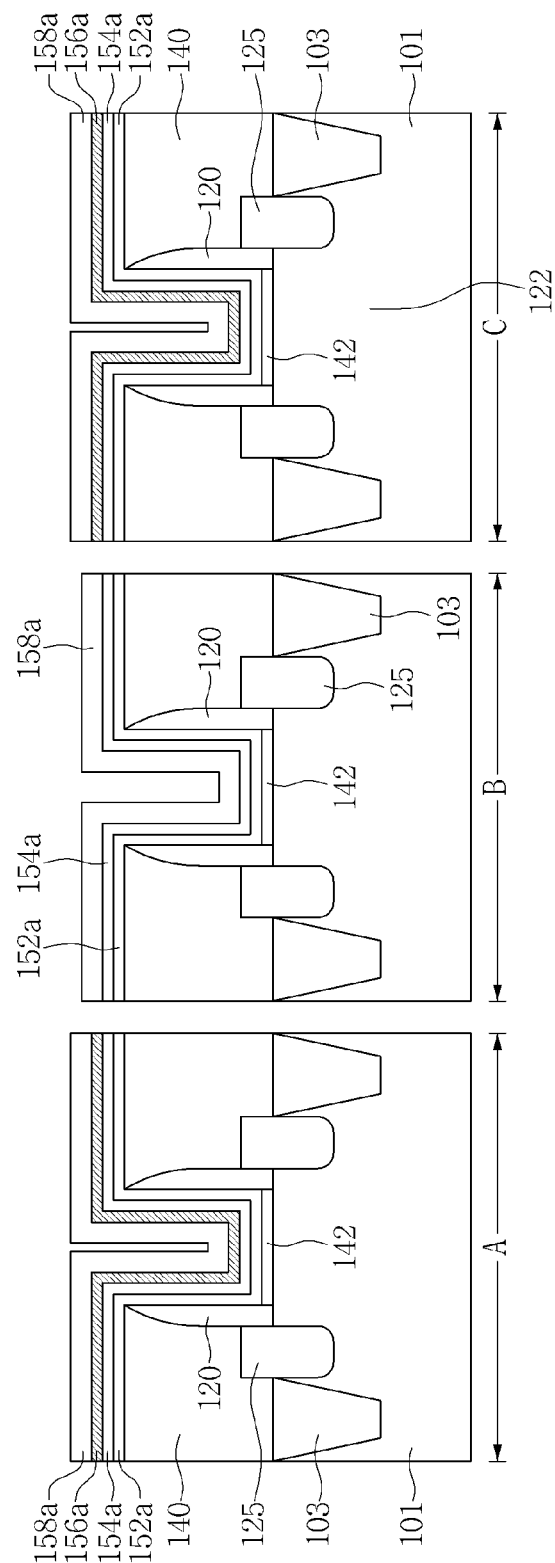
Figure 20:
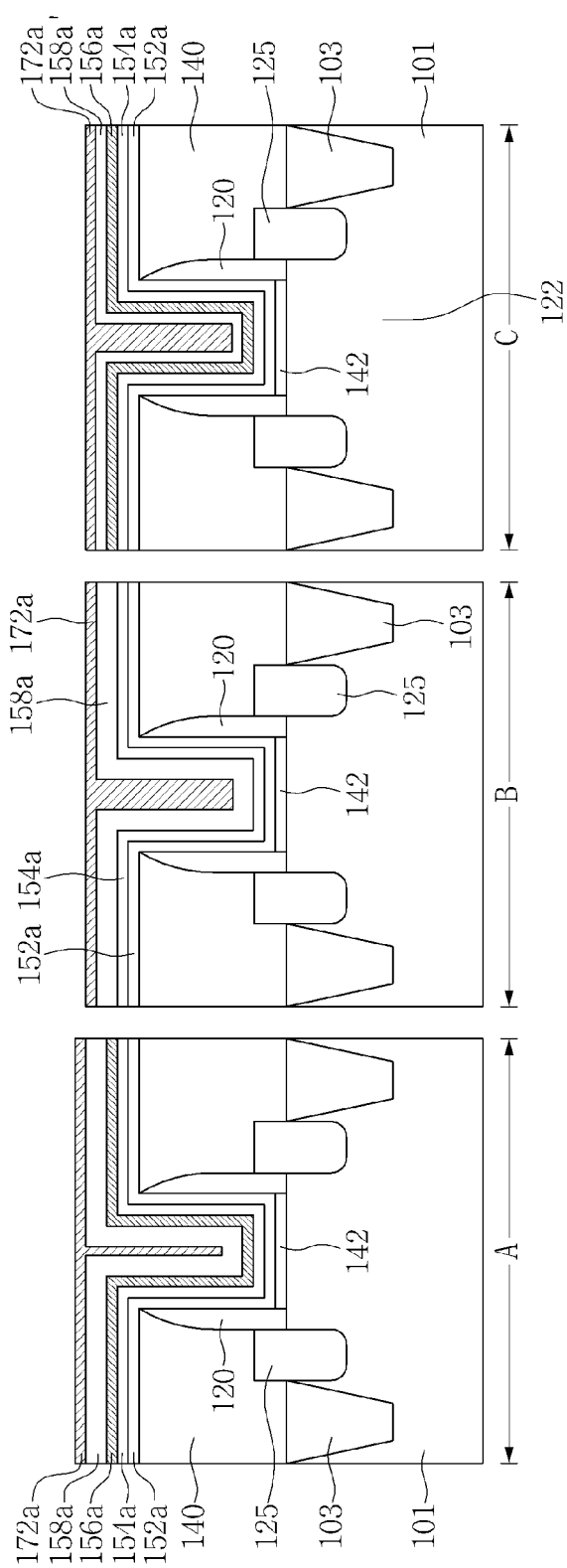
Figure 2P:
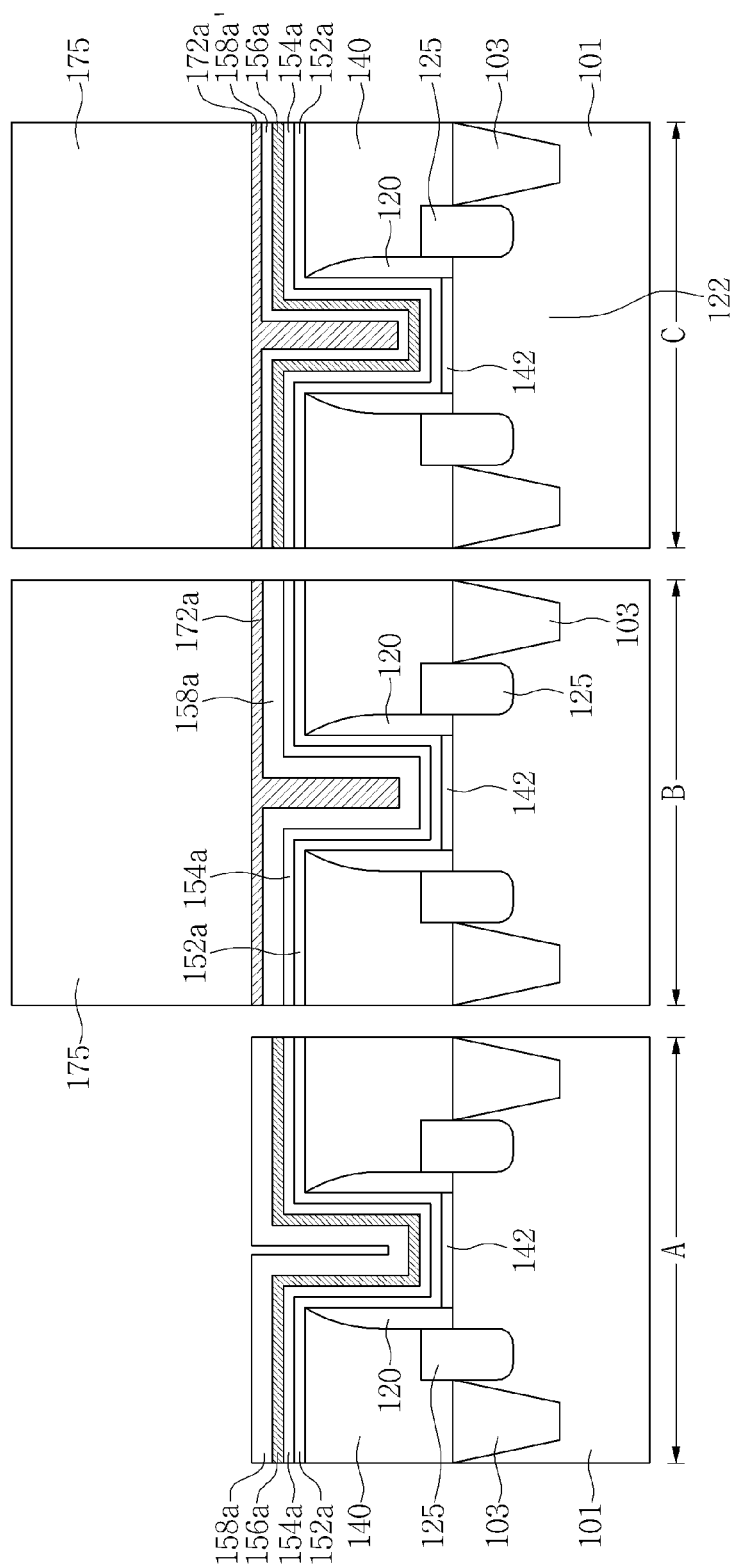
Figure 2Q:
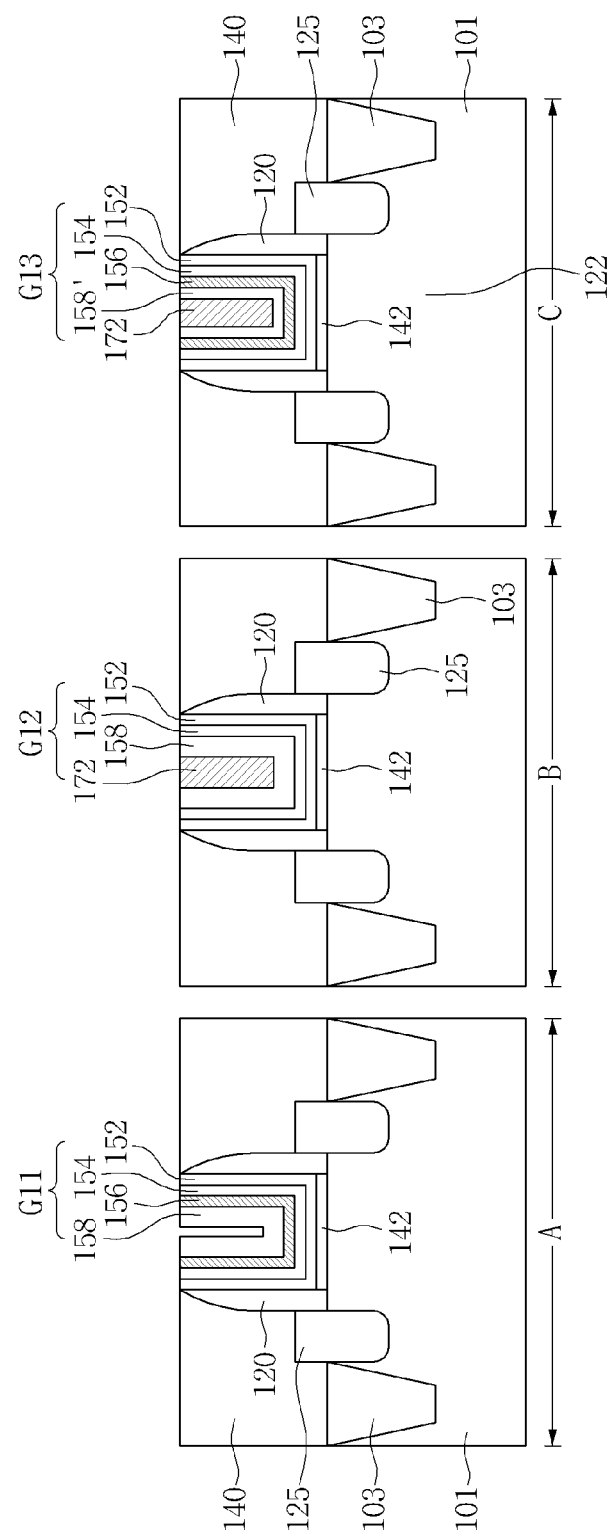

FIGS. 2A to 2Q are longitudinal sectional views for describing a method of fabricating the semiconductor device in accordance with an embodiment of the inventive concept.

Referring to FIG. 2A, the method of fabricating the semiconductor device according to an embodiment of the inventive concept may include preparing a substrate 101, and forming device isolation regions 103 in the substrate 101. The substrate 101 may include a region A in which low-Vt PMOS and super low-Vt PMOS transistors are formed, a region B in which high-Vt NMOS and high-Vt PMOS transistors are formed, and a region C in which low-Vt NMOS and super low-Vt NMOS transistors are formed. In certain embodiments, the substrate 101 may include a single-crystalline silicon, and the device isolation regions 103 may include silicon oxide.

The method may include forming surface insulating layers 105a on a surface of the substrate 101. The surface insulating layers 105a may be formed, for example, by performing a thermal oxidizing process which oxidizes the surface of the substrate 101. Accordingly, the surface insulating layers 105a may include thermally oxidized silicon.

Referring to FIG. 2B, the method may include forming sacrificial gate electrode material layers 114a on the surface insulating layers 105a and the device isolation regions 103, forming sacrificial gate hard mask layers 116a on the sacrificial gate electrode material layers 114a, and forming photoresist patterns 118 on the sacrificial gate hard mask layers 116a. The sacrificial gate electrode material layers 114a may include polysilicon, and the sacrificial gate hard mask layer 116a may include silicon nitride.

Referring to FIG. 2C, the method may include forming preliminary gate patterns 110p by performing an etch process using the photoresist patterns 118 as an etch mask. The preliminary gate patterns 110p may include surface insulating patterns 105 disposed on the surface of the substrate 101, sacrificial gate electrode patterns 114 disposed on the surface insulating patterns 105, and sacrificial gate hard mask patterns 116 disposed on the sacrificial gate electrode patterns 114. A part of the exposed surface of the substrate 101 may be recessed. Then, the photoresist patterns 118 may be removed.

Referring to FIG. 2D, the method may include entirely forming gate spacer material layers 120a. The gate spacer material layers 120a may be conformally formed on the preliminary gate patterns 110p, and the surface of the substrate 101 and surfaces of the device isolation regions 103. The gate spacer material layers 120a may include silicon nitride.

Referring to FIG. 2E, the method may include forming gate spacers 120 on side surfaces of the preliminary gate patterns 110p by performing an etch-back process. The etch-back process may expose the surface of the substrate 101, surfaces of the device isolation regions 103, and upper portions of the preliminary gate patterns 110p.

Referring to FIG. 2F, the method may include recessing the surface of the exposed substrate 101. The recessed substrate 101 may have a longitudinal section having a U-shape.

Referring to FIG. 2G, the method may include forming source/drain regions 125 which protrude from the surface of the substrate 101 by performing an epitaxial-growth process on the recessed substrate 101. For example, the source/drain regions 125 may include SiGe.

Referring to FIG. 2H, the method may include forming lower interlayer insulating layers 140, and exposing the sacrificial gate hard mask patterns 116 by performing a planarization process such as a CMP process. The lower interlayer insulating layers 140 may include silicon oxide.

Referring to FIG. 2I, the method may include forming gate electrode spaces GS which expose the insides of the gate spacers 120 and the surface of the substrate 101 by removing the exposed sacrificial gate hard mask patterns 116, the sacrificial gate electrode patterns 114, and the surface insulating patterns 105.

Referring to FIG. 2J, the method may include forming gate insulating patterns 142 on the surface of the exposed substrate 101. The gate insulating patterns 142 may be formed by performing a thermal oxidizing process which oxidizes the surface of the substrate 101. Accordingly, the gate insulating patterns 142 may include thermally oxidized silicon.

Referring to FIG. 2K, the method may include conformally forming gate dielectric layers 152a, gate barrier layers 154a, and lower gate electrode layers 156a in the gate electrode spaces GS on the gate insulating patterns 142. The gate dielectric layers 152a may include a high dielectric insulating material such as hafnium oxide (HfO), zirconium oxide (ZrO), or other metal oxides. The gate barrier layers 154a may include a metal for barrier such as titanium (Ti), titanium nitride (TiN), tantalum (Ta), or tantalum nitride (TaN). The lower gate electrode layers 156a may include a mid-gap work function metal. The lower gate electrode layers 156a may include a metal multilayer, a metal alloy layer and/or metal compound layers. For example, the lower gate electrode layers 156a may include a metal such as titanium nitride (TiN), tantalum nitride (TaN), cobalt (Co), titanium aluminum (TiAl), titanium aluminum carbide (TiAlC), or lanthanum oxide (La2O3).

Referring to FIG. 2L, the method may include exposing the gate barrier layer 154a by removing the lower gate electrode layer 156a in the region B after each of the region A and the region C is masked by a lower gate electrode etch mask 160. The lower gate electrode etch mask 160 may include a hard mask such as photoresist and/or silicon nitride.

Referring to FIG. 2M, the method may include removing the lower gate electrode etch masks 160 in the region A and the region C, and forming middle gate electrode layers 158a on the lower gate electrode layers 156a in the region A and the region C and the gate barrier layer 154a in the region B. The middle gate electrode layers 158a may include a mid-gap work function metal. For example, the middle gate electrode layers 158a may include a metal multilayer, a metal alloy layer and/or metal compound layers, and include a metal such as titanium nitride (TiN), tantalum nitride (TaN), cobalt (Co), titanium aluminum (TiAl), titanium aluminum carbide (TiAlC), or lanthanum oxide (La2O3). The middle gate electrode layers 158a may be formed to have thicknesses greater than the lower gate electrode layers 156a.

Referring to FIG. 2N, the method may include removing a part of the middle gate electrode layer 158a in the region C after each of the region A and the region B is masked by a middle gate electrode etch mask 162. The thin middle gate electrode layer 158a' in the region C may have a thickness smaller than the middle gate electrode layers 158a in the region A and the region B. The middle gate electrode etch mask 162 may include a hard mask such as photoresist and/or silicon nitride.

Referring to FIG. 2O, the method may include removing the middle gate electrode etch mask 162, and forming upper gate electrode layers 172a on the middle gate electrode layers 158a in the region A and the region B and the thin middle gate electrode 158a' in the region C. The upper gate electrode layers 172a may include a metal having high conductivity, such as tungsten (W) or copper (Cu).

Referring to FIG. 2P, the method may include removing the upper gate electrode layer 172a in the region A after each of the region B and the region C is masked by an upper gate electrode etch mask 175. The upper gate electrode etch mask 175 may include a hard mask such as photoresist and/or silicon nitride.

Referring to FIG. 2Q, the method may include removing the upper gate electrode etch masks 175 in the region B and the region C, and forming gate patterns G11, G12 and G13 in the region A to region C by removing the upper gate electrode layers 172a, the middle gate electrode layers 158a, the lower gate electrode layers 156a, the thin lower gate electrode layer 158a', the gate barrier layers 154a and the gate dielectric layers 152a on the lower interlayer insulating layers 140 by performing a planarization process such as a CMP process. The gate pattern G11 in the region A may include a gate dielectric pattern 152, a gate barrier pattern 154, a lower gate electrode 156 and a middle gate electrode 158. The gate pattern G12 in the region B may include the gate dielectric pattern 152, the gate barrier pattern 154, the middle gate electrode 158 and an upper gate electrode 172. The gate pattern G13 in the region C may include the gate dielectric pattern 152, the gate barrier pattern 154, the lower gate electrode 156, the thin middle gate electrode 158' and the upper gate electrode 172. The low-Vt and super low-Vt transistors in the region A and region C may be classified by an ion implantation process or adjusting the thicknesses of the lower gate electrode layer 156a and the middle gate electrode layer 158a.

Then, further referring to FIG. 1A, the method may include forming etch-stop layers 180 on upper surfaces of the gate patterns G11, G12 and G13 and the lower interlayer insulating layers 140, and forming an upper interlayer insulating layers 190 on the etch-stop layers 180. The etch-stop layers 180 may include silicon nitride. The upper interlayer insulating layers 190 may include silicon oxide.

FIGS. 3A to 3G are longitudinal sectional views for describing a method of fabricating a semiconductor device in accordance with another embodiment of the inventive concept.

Figure 3A:
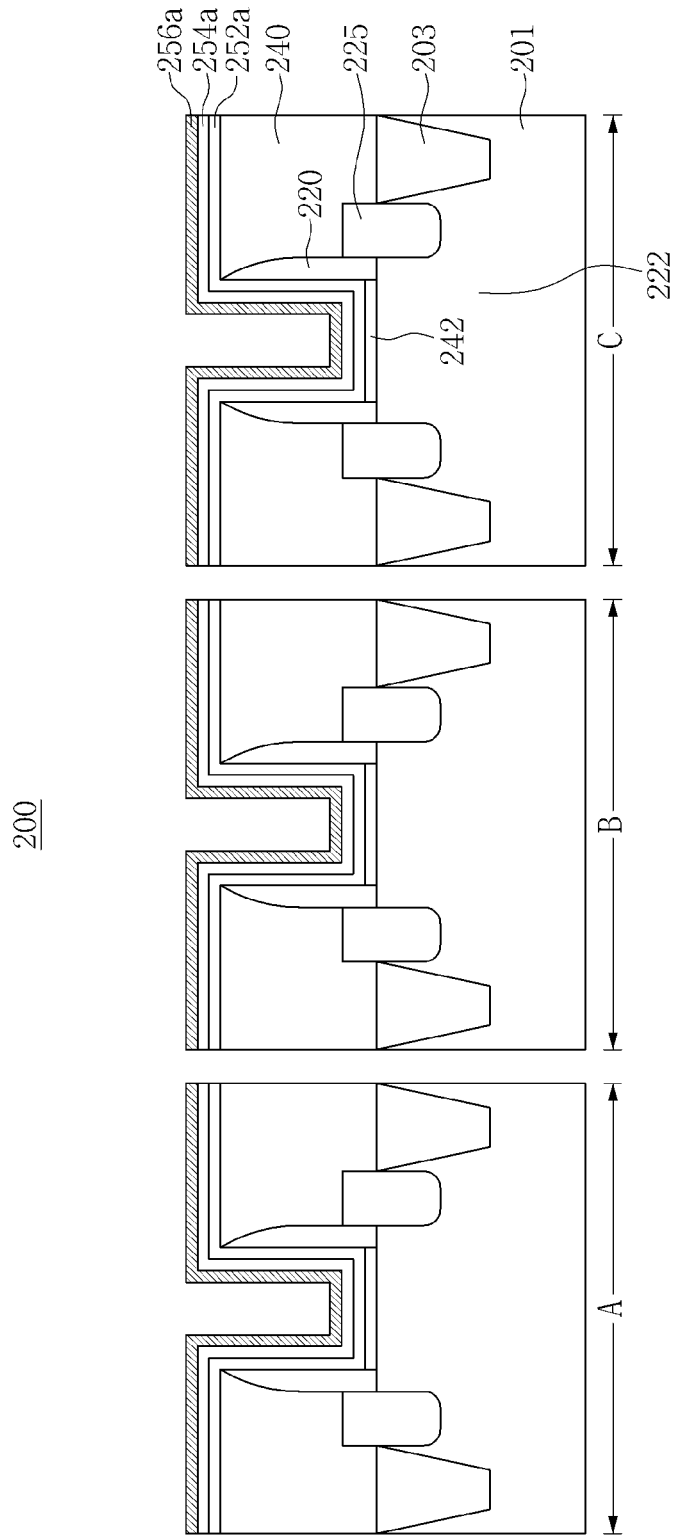
FIGS. 3A to 3G are longitudinal sectional views for describing a method of fabricating the semiconductor device in accordance with another embodiment of the inventive concept.

Referring to FIG. 3A, a method of fabricating the semiconductor device according to one embodiment of the inventive concept may include conformally forming gate dielectric layers 252a, gate barrier layers 254a, and lower gate electrode layers 256a in gate electrode spaces GS by performing the processes described with reference to FIGS. 2A to 2J. The gate dielectric layers 252a may include, for example, a high dielectric insulating material such as hafnium oxide (HfO), zirconium oxide (ZrO), or other metal oxides. The gate barrier layers 254a may include, for example, a metal that serves as a barrier, such as titanium (Ti), titanium nitride (TiN), tantalum (Ta), or tantalum nitride (TaN). In one embodiment, the lower gate electrode layers 256a may include a mid-gap work function metal. For example, the lower gate electrode layers 256a may include a metal multilayer, a metal alloy layer and/or metal compound layers, and include a metal such as titanium nitride (TiN), tantalum nitride (TaN), cobalt (Co), titanium aluminum (TiAl), titanium aluminum carbide (TiAlC), or lanthanum oxide (La2O3).

Figure 3B:
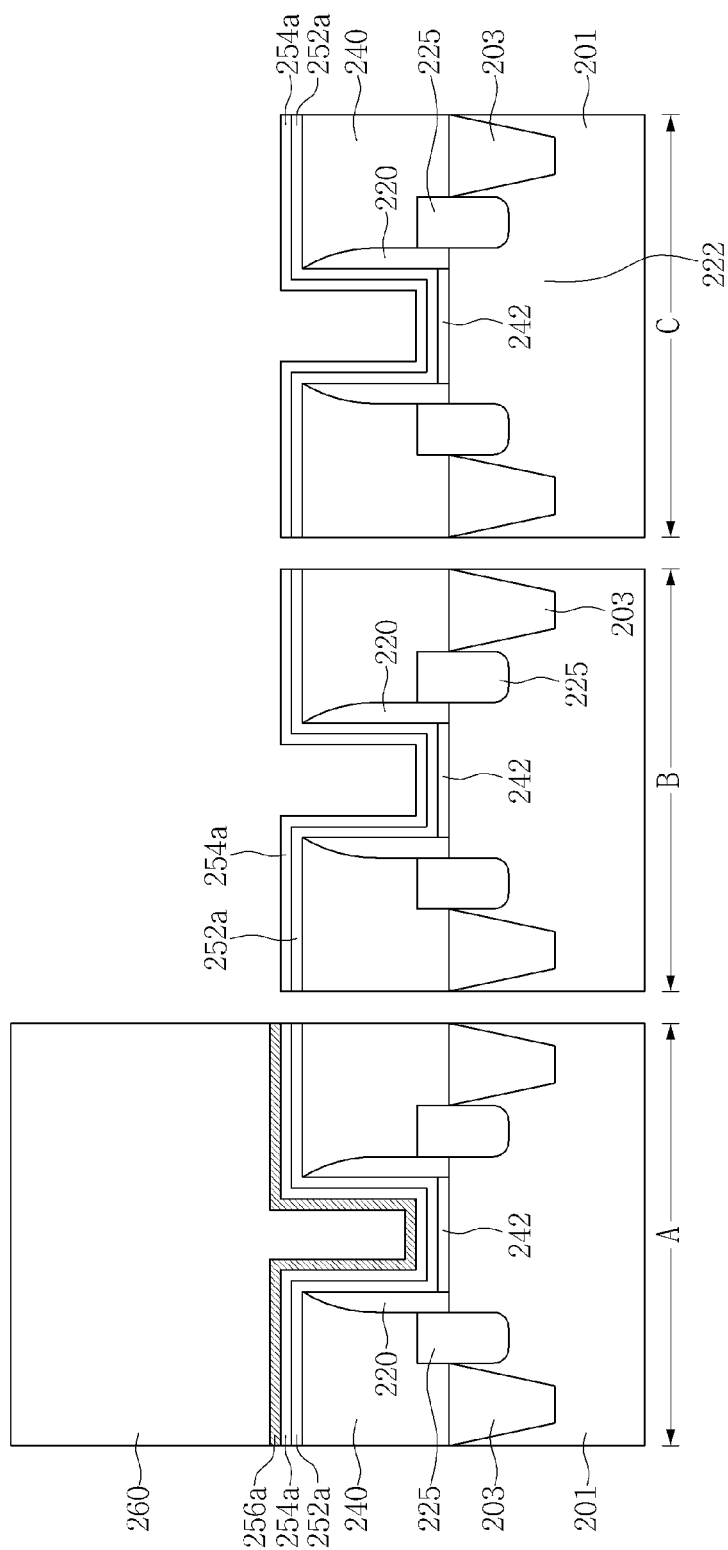

Referring to FIG. 3B, the method may include exposing the gate barrier layers 254a by removing the lower gate electrode layers 256a in a region B and a region C after a region A is masked by a lower gate electrode etch mask 260. The lower gate electrode etch mask 260 may include a hard mask such as photoresist and/or silicon nitride.

Figure 3C:
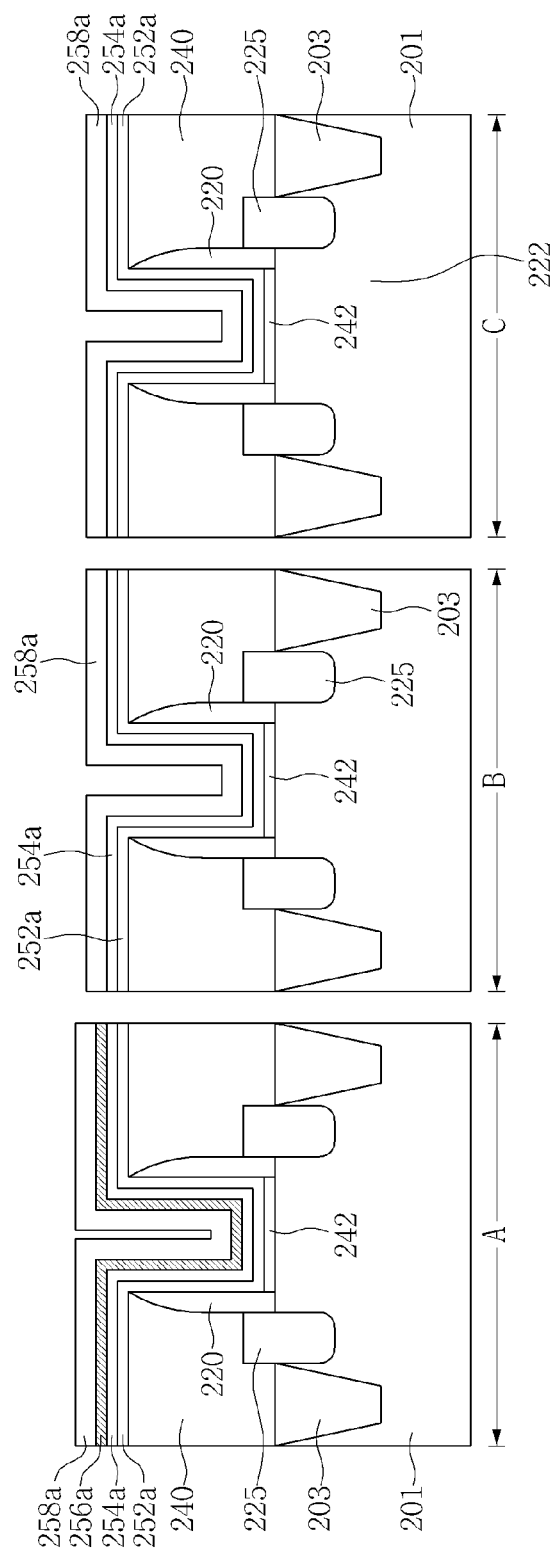

Referring to FIG. 3C, the method may include removing the lower gate electrode etch mask 260 in the region A, and conformally forming a middle gate electrode layer 258a on the lower gate electrode layer 256a in the region A and the gate barrier layers 254a in the region B and the region C. The middle gate electrode layer 258a may include a mid-gap work function metal. For example, middle gate electrode layer 258a may include a metal multilayer, a metal alloy layer and/or metal compound layers, and include a metal such as titanium nitride (TiN), tantalum nitride (TaN), cobalt (Co), titanium aluminum (TiAl), titanium aluminum carbide (TiAlC), or lanthanum oxide (La2O3). The middle gate electrode layer 258a may be formed to have a thickness greater than the lower gate electrode layer 256a.

Figure 3D:
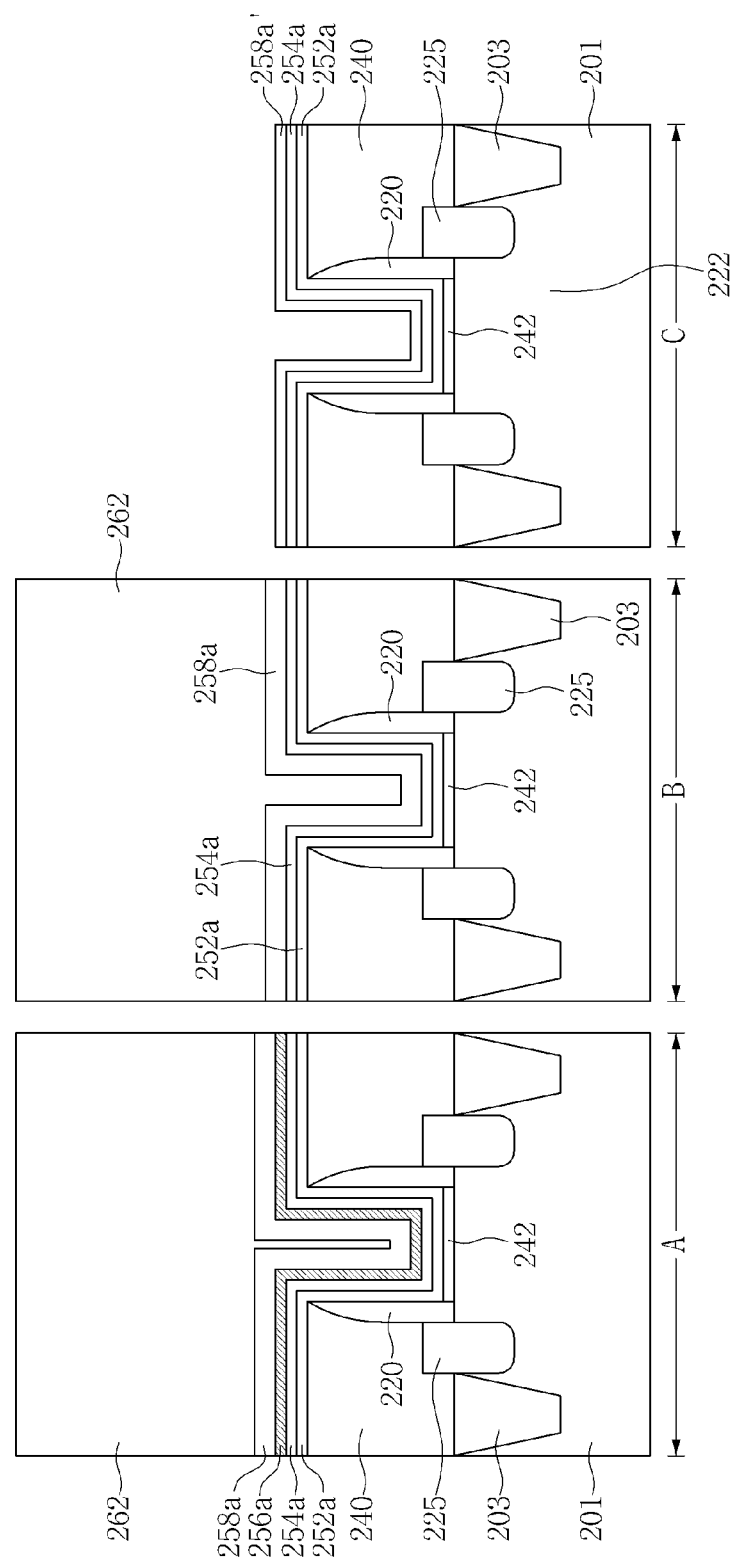

Referring to FIG. 3D, the method may include removing a part of the middle gate electrode layer 258a in the region C after each of the region A and the region B is masked by a middle gate electrode etch mask 262. The thin middle gate electrode layer 258a' in the region C may have a thickness smaller than the middle gate electrode layers 258a in the region A and the region B. The middle gate electrode etch mask 262 may include a hard mask such as photoresist and/or silicon nitride.

Figure 3E:
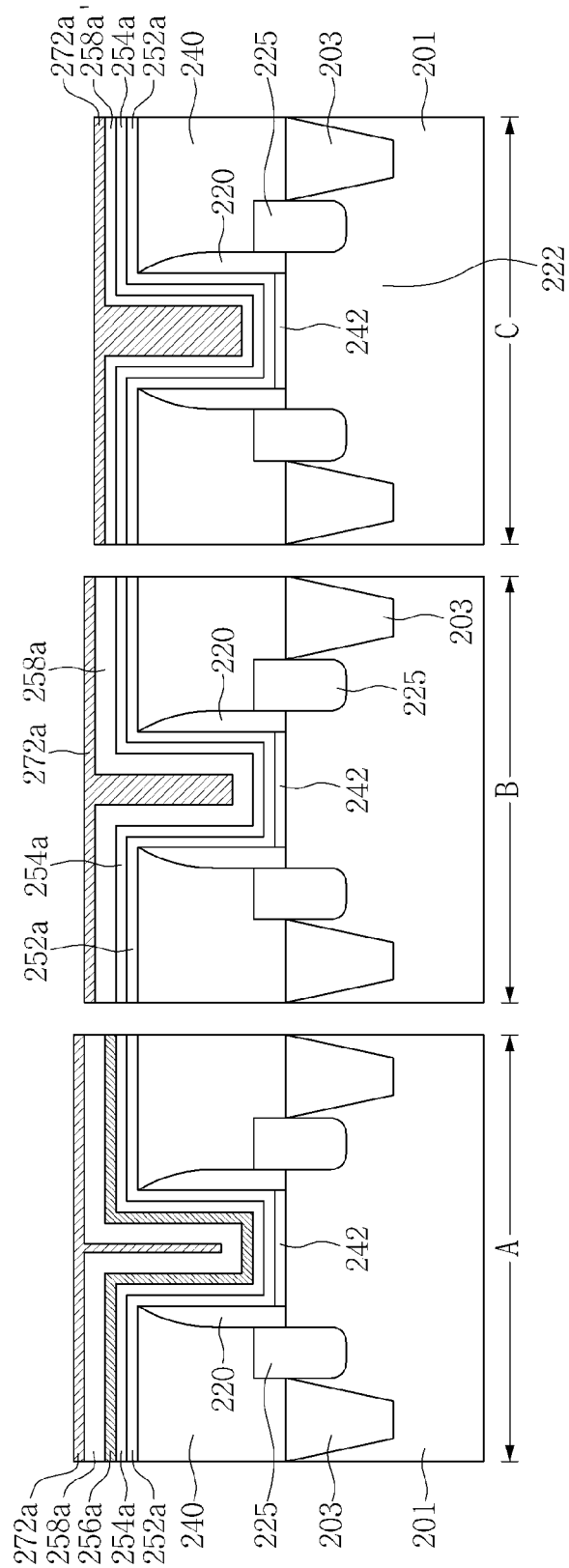

Referring to FIG. 3E, the method may include removing the middle gate electrode etch masks 262 in the region A and the region B, and forming an upper gate electrode layers 272a on the middle gate electrode layers 258a in the region A and the region B and the thin middle gate electrode layer 258a' in the region C. The upper gate electrode layers 272a may include a metal having high conductivity, such as tungsten (W) or copper (Cu).

Figure 3F:
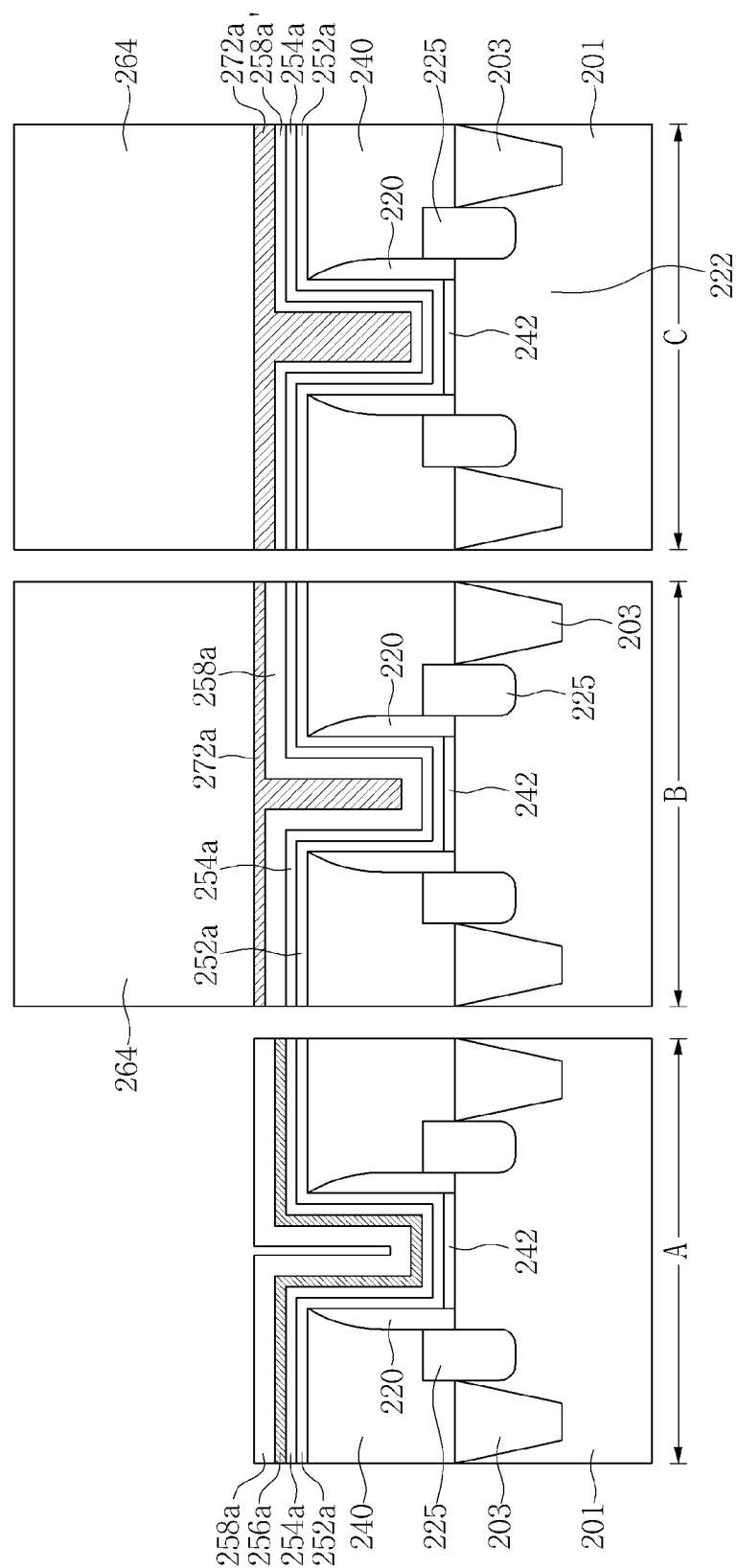

Referring to FIG. 3F, the method may include removing the upper gate electrode layer 272a in the region A after each of the region B and the region C is masked by a upper gate electrode etch mask 264. The upper gate electrode etch mask 264 may include a hard mask such as photoresist and/or silicon nitride.

Figure 3G:
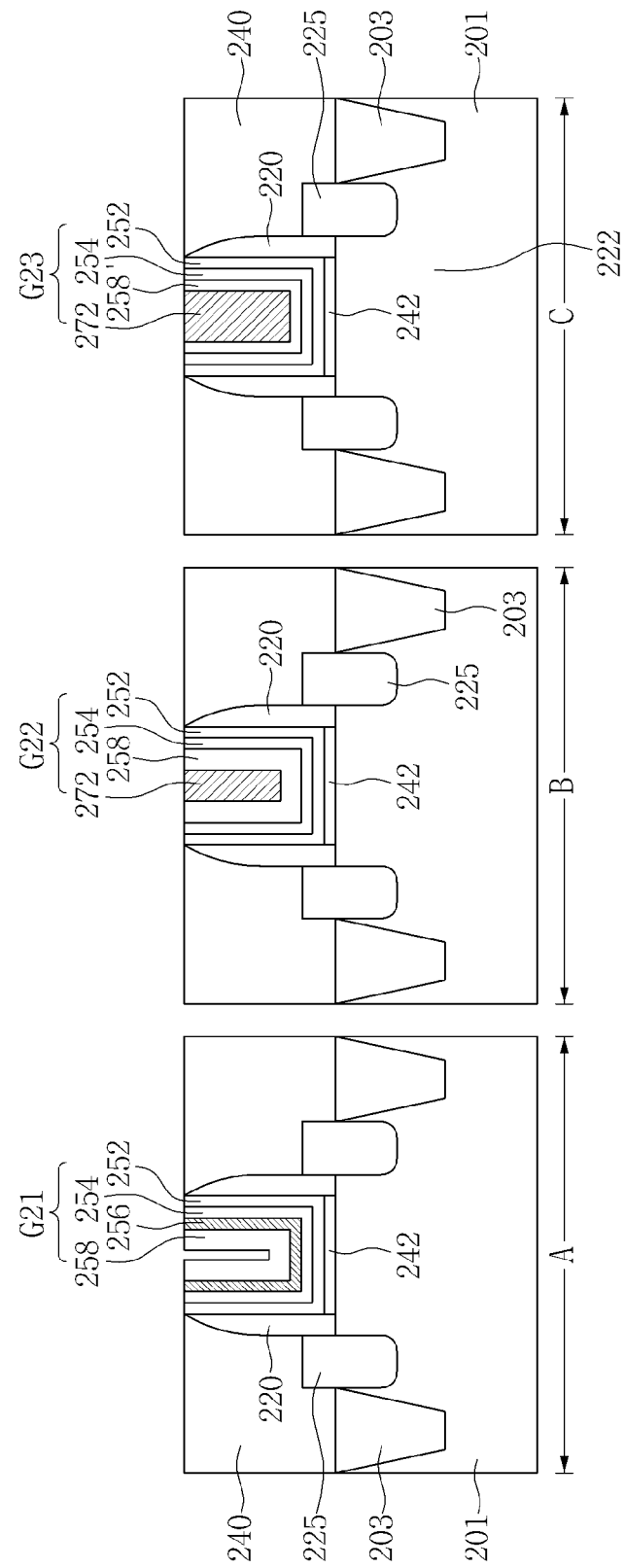

Referring to FIG. 3G, the method may include removing the upper gate electrode etch mask 264 in the region B and the region C, and forming gate patterns G21, G22 and G23 in the region A to region C by removing the upper gate electrode layers 272a, the middle gate electrode layers 258a, the lower gate electrode layer 256a, the thin lower gate electrode layers 258a', the gate barrier layers 254a and the gate dielectric layers 252a on the lower interlayer insulating layers 240 by performing a planarization process such as a CMP process. The gate pattern G21 in the region A may include a gate dielectric pattern 252, a gate barrier pattern 254, a lower gate electrode 256 and a middle gate electrode 258. The gate pattern G22 in the region B may include the gate dielectric pattern 252, the gate barrier pattern 254, the middle gate electrode 258 and an upper gate electrode 272. The gate pattern G23 in the region C may include the gate dielectric pattern 252, the gate barrier pattern 254, the thin upper gate electrode 258' and the upper gate electrode 272. The low-Vt and super low-Vtin transistors in the region A and the region C may be classified by an ion implantation process or adjusting the thicknesses of the lower gate electrode layer 256a and the middle gate electrode layer 258a.

Then, referring to FIG. 1B, the method may include forming etch-stop layers 280 on upper surfaces of the gate patterns G21, G22 and G23 and the lower interlayer insulating layers 240, and forming upper interlayer insulating layers 290 on the etch-stop layers 280. The etch-stop layers 280 may include silicon nitride. The upper interlayer insulating layers 290 may include silicon oxide.

FIGS. 4A to 4F are longitudinal sectional views for describing a method of fabricating the semiconductor device in accordance with still another embodiment of the inventive concept.

Figure 4A:
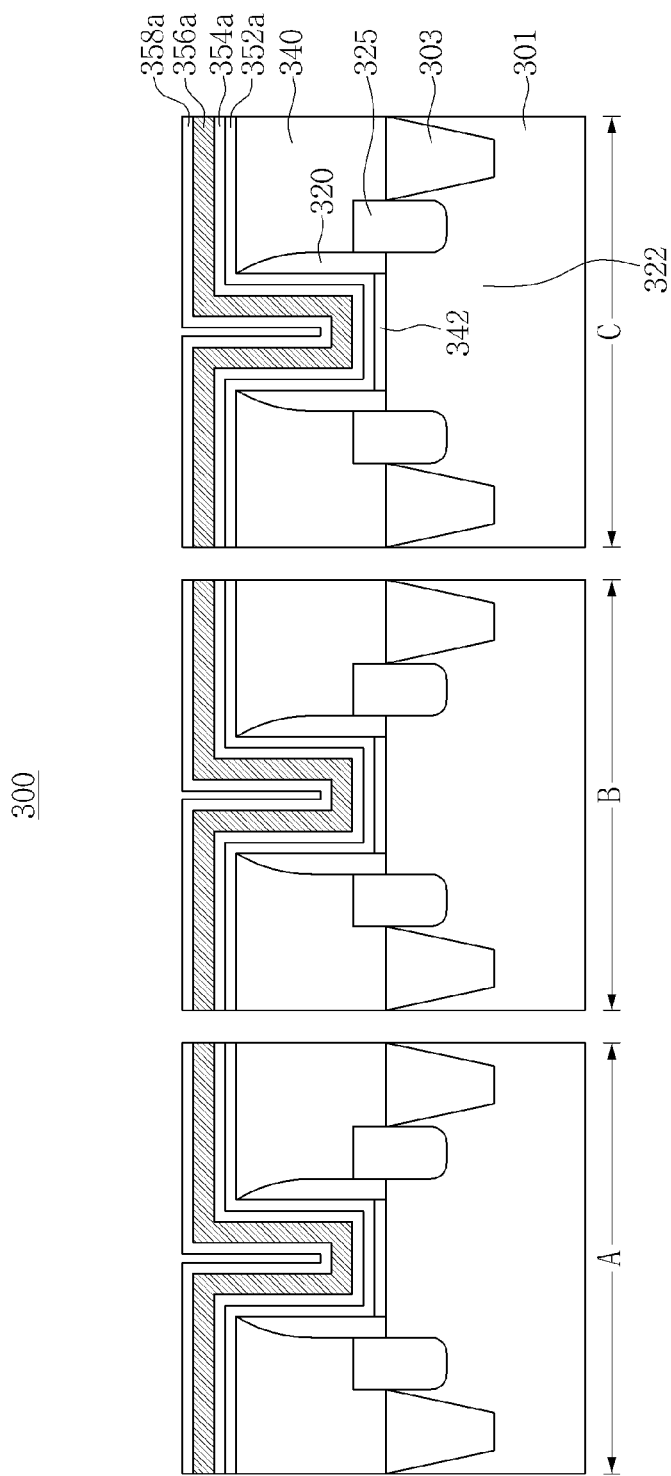

Referring to FIG. 4A, the method of fabricating the semiconductor device according to one embodiment of the inventive concept may include conformally forming gate dielectric layers 352a, gate barrier layers 354a, lower gate electrode layers 356a, and middle gate electrode layers 358a in gate electrode spaces GS by performing the processes described with reference to FIGS. 2A to 2J. The gate dielectric layers 352a may include a high dielectric insulating material such as hafnium oxide (HfO), zirconium oxide (ZrO), or other metal oxides. The gate barrier layers 354a may include a metal for a barrier, such as titanium (Ti), titanium nitride (TiN), tantalum (Ta), or tantalum nitride (TaN). The lower gate electrode layers 356a and middle gate electrode layers 358a may include a mid-gap work function metal. For example, the lower gate electrode layers 356a and the middle gate electrode layers 358a may include a metal multilayer, a metal alloy layer and/or metal compound layers, and include a metal such as titanium nitride (TiN), tantalum nitride (TaN), cobalt (Co), titanium aluminum (TiAl), titanium aluminum carbide (TiAlC), or lanthanum oxide (La2O3). The lower gate electrode layers 356a may be formed to have thicknesses greater than the middle gate electrode layers 358a.

Figure 4B:
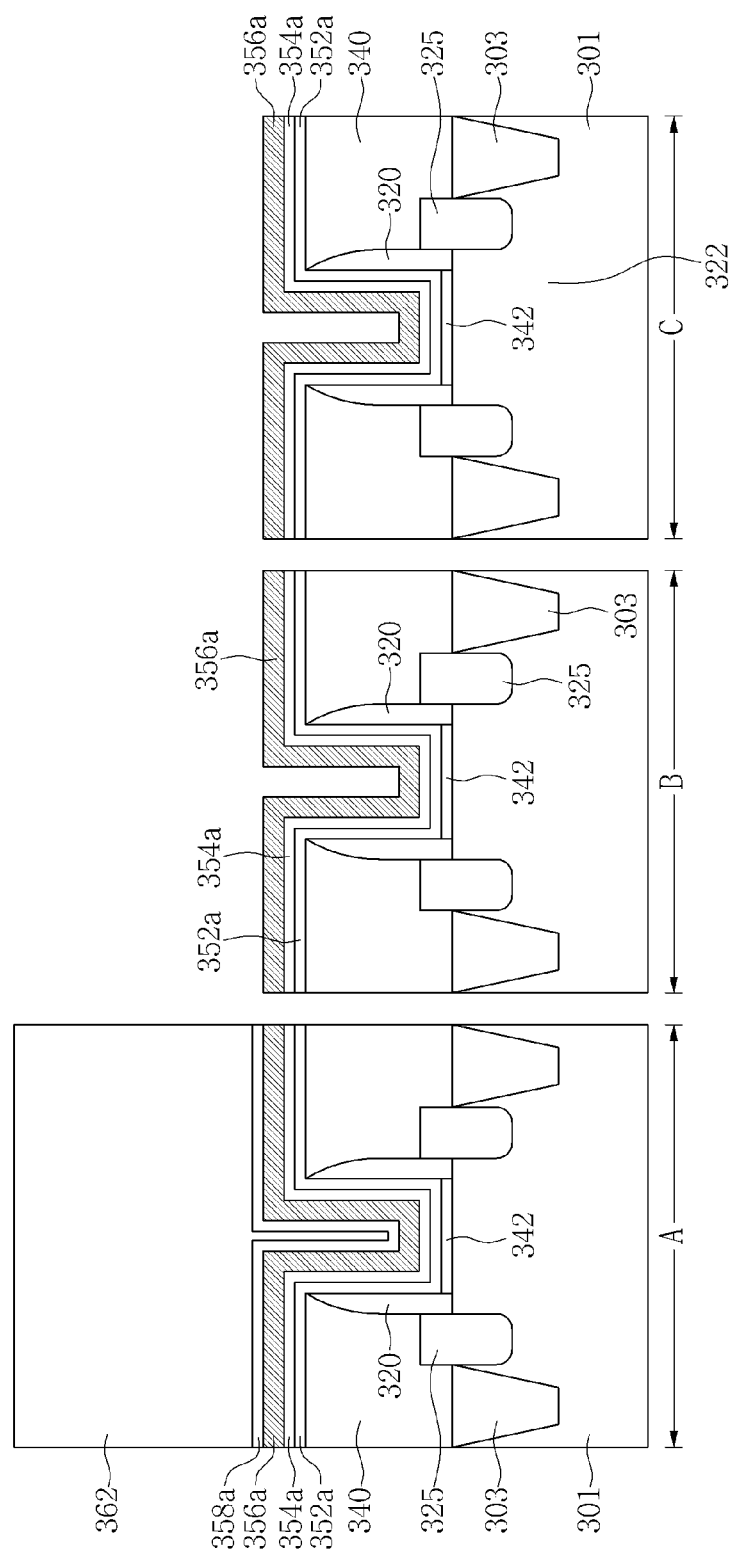

Referring to FIG. 4B, the method may include exposing the lower gate electrode layers 356a by removing the middle gate electrode layers 358a in region B and region C after the region A is masked by a middle gate electrode etch mask 362. The middle gate electrode etch mask 362 may include a hard mask such as photoresist and/or silicon nitride. Then, the middle gate electrode etch mask 362 may be removed.

Figure 4C:
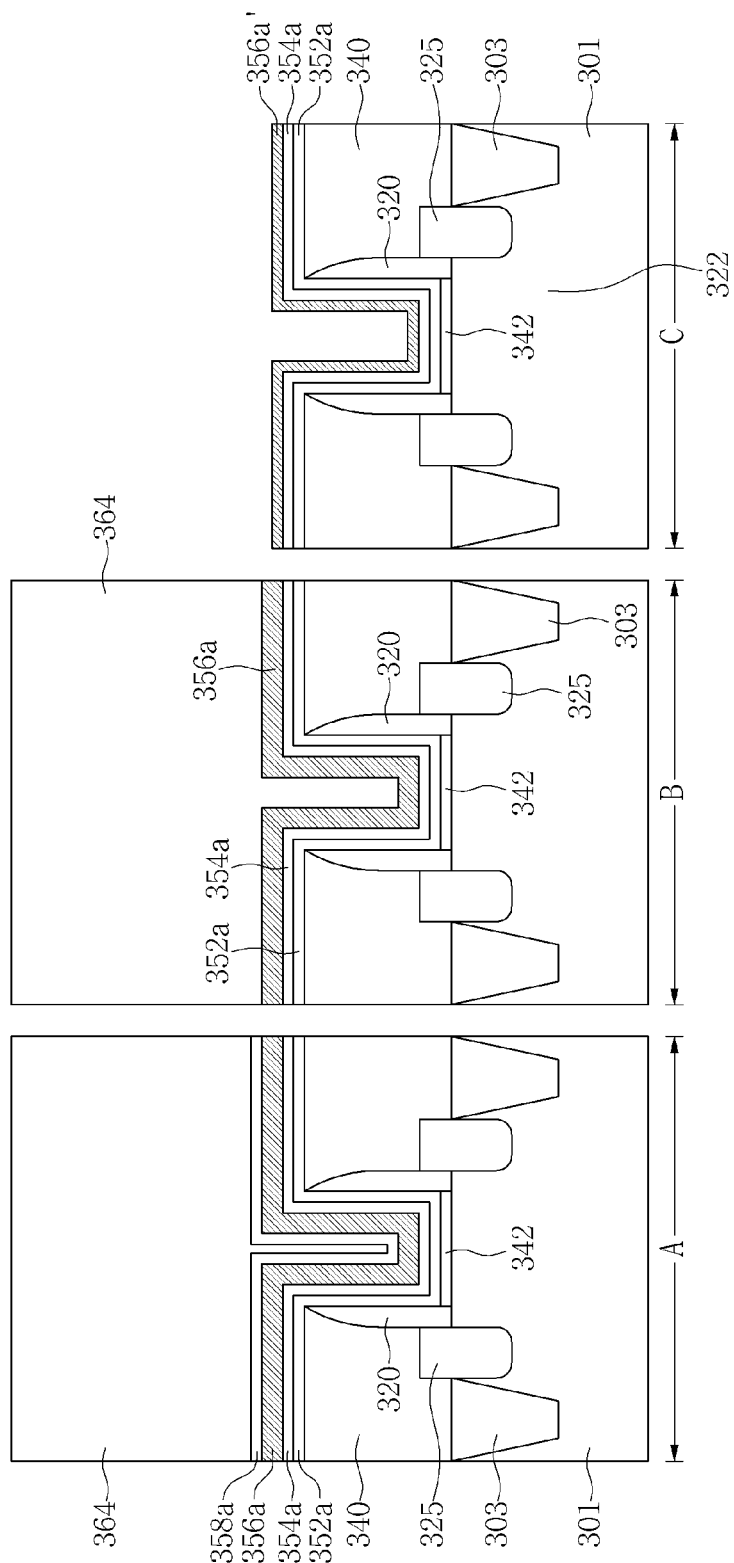

Referring to FIG. 4C, the method may include removing a part of the lower gate electrode layer 356a in the region C after each of the region A and the region B is masked by a lower gate electrode etch mask 364. The thin lower gate electrode layer 356a' in the region C may have a thickness smaller than the lower gate electrode layers 356a in the region A and the region B. The lower gate electrode etch mask 364 may include a hard mask such as photoresist and/or silicon nitride.

Figure 4D:
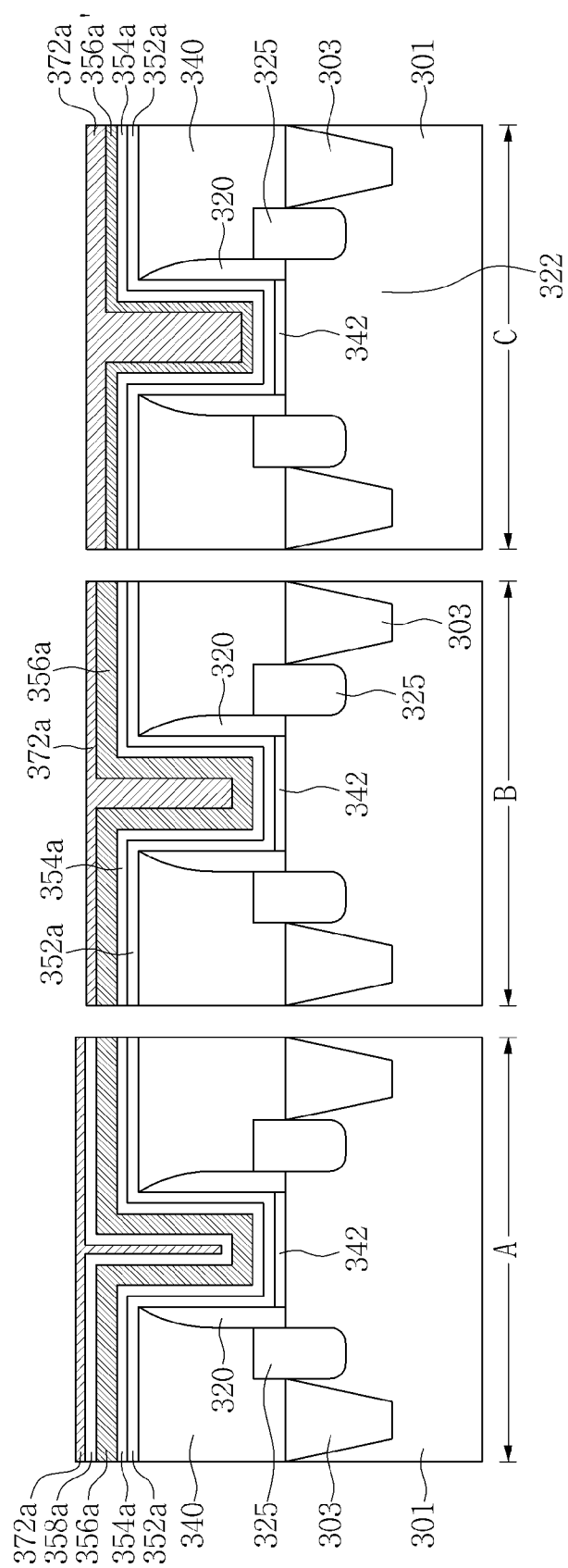

Referring to FIG. 4D, the method may include removing the lower gate electrode etch masks 364 in the region A and the region B, and conformally forming an upper gate electrode layer 372a on the middle gate electrode layer 358a in the region A and the lower gate electrode layer 356a in the region B, and the thin lower gate electrode layer 356a' in the region C. The upper gate electrode layer 372a may include a metal having high conductivity, such as tungsten (W) or copper (Cu).

Figure 4E:
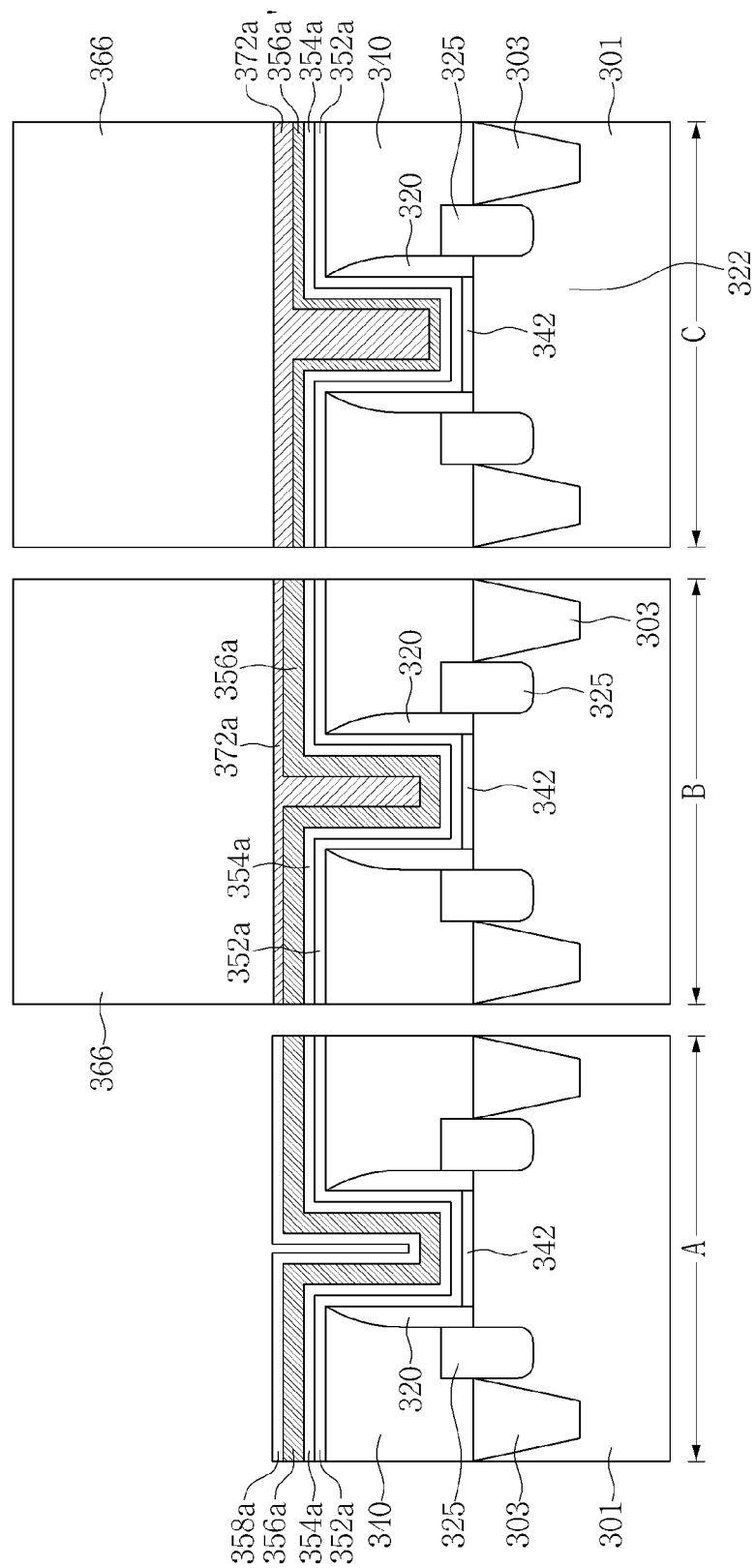

Referring to FIG. 4E, the method may include removing the upper gate electrode layer 372a in the region A after each of the region B and the region C is masked by an upper gate electrode etch mask 366. The upper gate electrode etch mask 366 may include a hard mask such as photoresist and/or silicon nitride.

Referring to FIG. 4F, the method may include removing the upper gate electrode etch masks 366 in the region B and the region C and forming gate patterns G31, G32 and G33 in the region A to region C by removing the upper gate electrode layers 372a, the middle gate electrode layer 358a, the lower gate electrode layers 356a, the thin lower gate electrode layer 356a', the gate barrier layers 354a and the gate dielectric layers 352a on the lower interlayer insulating layers 340 by performing a planarization process such as a CMP process. The gate pattern G31 in the region A may include a gate dielectric pattern 352, a gate barrier pattern 354, a lower gate electrode 356 and a middle gate electrode 358. The gate pattern G32 in the region B may include the gate dielectric pattern 352, the gate barrier pattern 354, the lower gate electrode 356 and an upper gate electrode 372. The gate pattern G33 in the region C may include the gate dielectric pattern 352, the gate barrier pattern 354, the thin lower gate electrode 356' and the upper gate electrode 372. The low-Vt and super low-Vtin transistors in the region A and region C may be classified by an ion implantation process or adjusting thicknesses of the lower gate electrode layer 356a and the middle gate electrode layer 358a.

Then, referring to FIG. 1C, the method may include forming etch-stop layers 380 on upper surfaces of the gate patterns G31, G32 and G33 and the lower interlayer insulating layers 340, and forming upper interlayer insulating layers 390 on the etch-stop layers 380. The etch-stop layers 380 may include silicon nitride. The upper interlayer insulating layers 390 may include, for example, silicon oxide.

Figure 5:
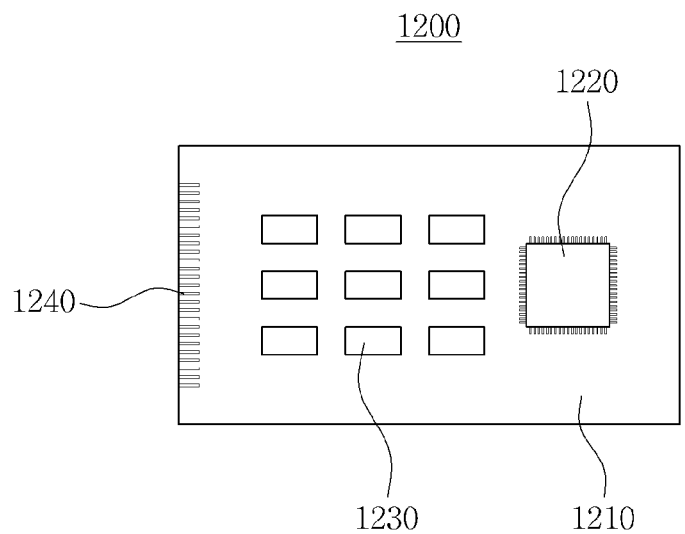
FIG. 5 is a conceptual view illustrating a semiconductor module in accordance with an embodiment of the inventive concept.

FIG. 5 is a conceptual view illustrating a semiconductor module in accordance with an embodiment of the inventive concept.

Referring to FIG. 5, the semiconductor module 1200 according to one embodiment of the inventive concept may include a processor 1220 and a semiconductor device 1230 which are mounted on a module substrate 1210. The processor 1220 or the semiconductor device 1230 may include at least one of the semiconductor devices in accordance with the various embodiments of the inventive concept. Input/output (I/O) terminals 1240 may be disposed on at least one side of the module substrate 1210.

Figure 6:
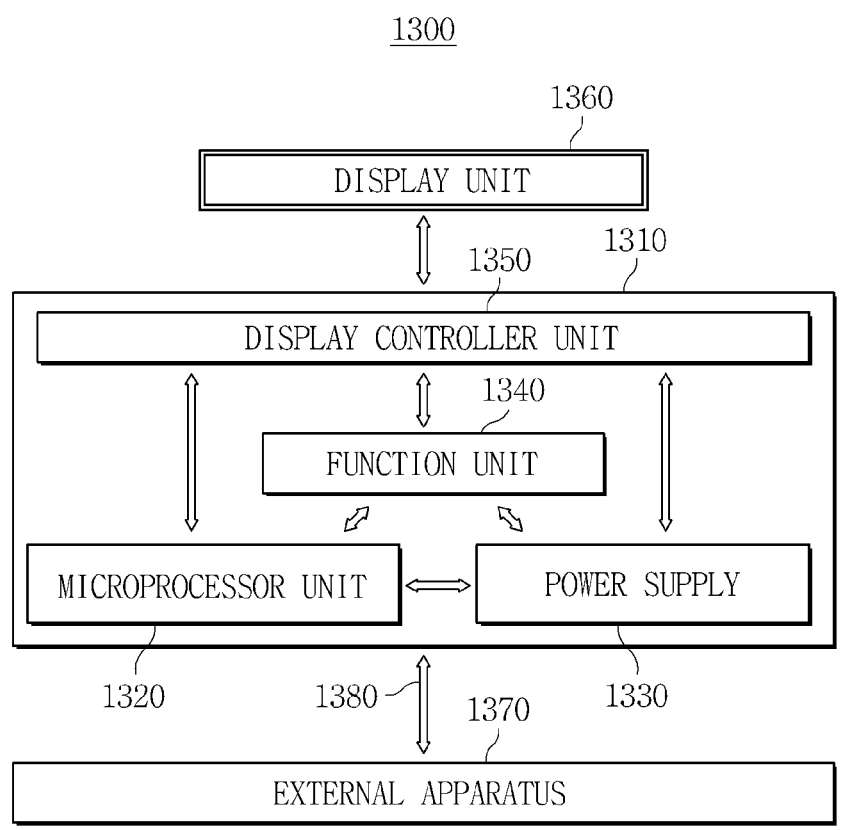
FIGS. 6 and 7 are conceptual block diagrams illustrating electronic systems in accordance with embodiments of the inventive concept.
Figure 7:
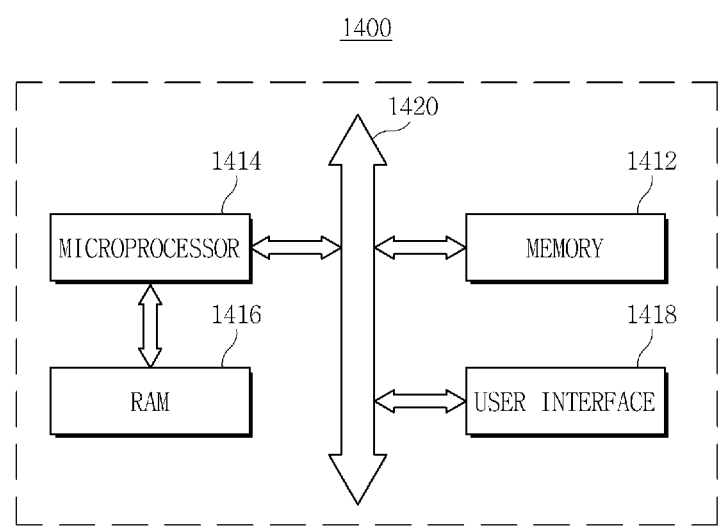

FIGS. 6 and 7 are conceptual block diagrams illustrating electronic systems in accordance with embodiments of the inventive concept.

Referring to FIG. 6, the electronic system 1300 according to an embodiment of the inventive concept may include a body 1310, a display unit 1360, and an external apparatus 1370.

The body 1310 may include a microprocessor unit 1320, a power supply 1330, a function unit 1340, and/or a display control unit 1350. The body 1310 may include a system board or motherboard having a printed circuit board (PCB) and the like, and/or a case. The microprocessor unit 1320, the power supply 1330, the function unit 1340, and the display control unit 1350 may be mounted or disposed on an upper surface or inside of the body 1310. The display unit 1360 may be disposed on the upper surface or inside/outside of the body 1310. The body 1310 and display unit 1360 may form an electronic device, that includes one or more of the semiconductor devices described in connection with FIGS. 1A-4F. For example, the electronic device may include a tablet, laptop, desktop computer, cell phone, or similar device.

The display unit 1360 may display an image processed by the display control unit 1350. For example, the display unit 1360 may include a liquid crystal display (LCD), an active matrix organic light emitting diodes (AMOLED), or various display panels. The display unit 1360 may include a touch screen. Accordingly, the display unit 1360 may have I/O functions.

The power supply 1330 may supply a current or voltage to the microprocessor unit 1320, the function unit 1340, the display control unit 1350, etc. The power supply 1330 may include a charging battery, a socket for a dry cell, or a voltage/current converter.

The microprocessor unit 1320 may receive a voltage from the power supply 1330 to control the function unit 1340 and the display unit 1360. For example, the microprocessor unit 1320 may include a CPU or an application processor (AP).

The function unit 1340 may perform the functions of various electronic systems 1300. For example, the function unit 1340 may include a touch pad, a touch screen, volatile/non-volatile memories, a memory card controller, a camera, a light, a voice and moving picture reproducing processor, a wireless transmitting/receiving antenna, a speaker, a microphone, a USB port, or other units having various functions.

The microprocessor unit 1320 or the function unit 1340 may include at least one of the semiconductor devices in the various embodiments of the inventive concept.

Referring to FIG. 7, the electronic system 1400 according to an embodiment of the inventive concept may include a microprocessor 1414, a memory system 1412, and a user interface 1418 which perform data communication through a bus 1420. The microprocessor 1414 may include a CPU or an AP. The electronic system 1400 may further include a RAM 1416 in direct communication with the microprocessor 1414. The microprocessor 1414 and/or the RAM 1416 may be assembled in a single package. The user interface 1418 may be used to input information into the electronic system 1400 or output information from the electronic system 1400. For example, the user interface 1418 may include a touch pad, a touch screen, a keyboard, a mouse, a scanner, a voice detector, a cathode ray tube (CRT) monitor, an LCD, an AMOLED, a plasma display panel (PDP), a printer, a light, or various I/O devices. The memory system 1412 may store operational codes of the microprocessor 1414, data processed by the microprocessor 1414, or external input data. The memory system 1412 may include a memory controller, a hard disk, or a solid state drive (SSD). The microprocessor 1414, the RAM 1416, and/or the memory system 1412 may include at least one of the semiconductor devices in accordance with the various embodiments of the inventive concept.

In the semiconductor device according to the various embodiments of the inventive concept, gate electrodes of NMOS and PMOS transistors may be formed of the same material using a mid-gap work function metal. Accordingly, the cost of fabricating the semiconductor device can be reduced.

In the semiconductor device according to the various embodiments of the inventive concept, since the high-Vt NMOS, low-Vt NMOS and super low-Vt NMOS transistors, which are the same types, or the high-Vt PMOS, low-Vt PMOS and super low-Vt PMOS transistors, which are the same types, are classified by a thickness of the mid-gap work function metal, electrical characteristics of transistors can be improved.

In the semiconductor device according to the various embodiments of the inventive concept, since the high-Vt PMOS and high-Vt NMOS transistors are classified by the mid-gap work function metal instead of an ion implantation process, characteristics of local mismatch occurring from the ion implantation process can be improved.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising a first gate pattern, a second gate pattern, and a third gate pattern disposed on an active region of a substrate,
    wherein the first gate pattern includes:
    a first gate insulating pattern formed on the active region of the substrate;
    a first gate dielectric pattern disposed on the first gate insulating pattern;
    a first gate barrier pattern disposed on the first gate dielectric pattern;
    a first metal layer including a first metal, the first metal layer disposed directly on the first gate barrier pattern; and
    a second metal layer including a second metal, the second metal layer disposed directly on the first metal layer, such that the first metal layer is between the first gate barrier pattern and the second metal layer,
    the second gate pattern includes:
    a second gate insulating pattern formed on the active region of the substrate;
    a second gate dielectric pattern disposed on the second gate insulating pattern;
    a second gate barrier pattern disposed on the second gate dielectric pattern;
    the second metal layer disposed directly on the second gate barrier pattern; and
    a third metal layer including a third metal, the third metal layer, disposed directly on the second metal layer, such that the second metal layer is between the second gate barrier pattern and the third metal layer, and
    the third gate pattern includes:
    a third gate insulating pattern formed on the active region of the substrate;
    a third gate dielectric pattern disposed on the third gate insulating pattern;
    a third gate barrier pattern disposed on the third gate dielectric pattern;
    the first metal layer disposed directly on the third gate barrier pattern;
    a fourth metal layer disposed directly on the first metal layer, such that the first metal layer is between the third gate barrier pattern and the fourth metal layer; and
    a fifth metal layer disposed directly on the fourth metal layer, such that the fourth metal layer is between the first metal layer and the fifth metal layer,
    wherein the sum of thicknesses of the first metal layer and the second metal layer of the first gate pattern is greater than a thickness of the second metal layer of the second gate pattern, and the sum of thicknesses of the first metal layer and the fourth metal layer of the third gate pattern is smaller than the thickness of the second metal layer of the second gate pattern.

2. The semiconductor device of claim 1, wherein the second metal layer of each of the first gate pattern and second gate pattern is formed to have a thickness greater than the thickness of the first metal layer of each of the first gate pattern and third gate pattern.

3. The semiconductor device of claim 1, wherein the fourth metal layer and the fifth metal layer of the third gate pattern are formed to each have a thickness smaller than the thickness of the second metal layer of each of the first gate pattern and the second gate pattern.

4. The semiconductor device of claim 1, wherein the fourth metal layer of the third gate pattern is formed of the same material as the second metal layer of each of the first gate pattern and second gate pattern.

5. The semiconductor device of claim 1, wherein a longitudinal section of the second metal layer has a U-shape, and longitudinal sections of the third metal layer and the fifth metal layer each have vertical bar shapes.

6. The semiconductor device of claim 1, wherein each of the first, second, and fourth metal layers includes titanium nitride (TiN), tantalum nitride (TaN), cobalt (Co), titanium aluminum (TiAl), titanium aluminum carbide (TiAlC), or lanthanum oxide (La2O3).

7. The semiconductor device of claim 1, wherein longitudinal sections of the first to third gate insulating patterns have horizontal bar shapes.

8. The semiconductor device of claim 1, further comprising source/drain regions formed on the active region, and located at opposite side surfaces of the active region.

9. The semiconductor device of claim 8, wherein the source/drain regions include epitaxial-grown SiGe.

10. The semiconductor device of claim 8, further comprising a lower interlayer insulating layer configured to surround side surfaces of the first to third gate patterns and cover the source/drain regions.

11. The semiconductor device of claim 10, wherein the lower interlayer insulating layer has the same upper surface as the first to third gate patterns.

12. The semiconductor device of claim 1, further comprising gate spacers formed on side surfaces of the first to third gate patterns.

13. The semiconductor device of claim 12, wherein inner surfaces of the gate spacers are in contact with outer surfaces of the first to third gate dielectric patterns.

14. The semiconductor device of claim 12, wherein outer ends of the gate spacers are in contact with inner ends of source/drain regions.

15. The semiconductor device of claim 1, wherein:
    the fourth metal layer of the third gate pattern is formed of the same material as the second metal layer of each of the first and second gate patterns; and
    the fifth metal layer of the third gate pattern is formed of the same material as the third metal layer of the second gate pattern.

16. A semiconductor device, comprising:
    a first gate pattern, a second gate pattern, and a third gate pattern which are disposed on active regions of a substrate;
    source/drain regions located at opposite side surfaces of the active regions;

lower interlayer insulating layers configured to surround side surfaces of the first to third gate patterns;
etch-stop layers formed on upper surfaces of the first to third gate patterns and the lower interlayer insulating layers; and
upper interlayer insulating layers formed on the etch-stop layers,
wherein the first gate pattern includes:
a first gate insulating pattern formed on the active region of the substrate;
a first gate dielectric pattern disposed on the first gate insulating pattern;
a first gate barrier pattern disposed on the first gate dielectric pattern;
a first metal directly formed on the first gate barrier pattern; and
a second metal directly formed on the first metal,
the second gate pattern includes:
a second gate insulating pattern formed on the active region of the substrate;
a second gate dielectric pattern disposed on the second gate insulating pattern;
a second gate barrier pattern disposed on the second gate dielectric pattern;
the second metal directly formed on the second gate barrier pattern; and
a third metal directly formed on the second metal, and
the third gate pattern includes:
a third gate insulating pattern formed on the active region of the substrate;
a third gate dielectric pattern disposed on the third gate insulating pattern;
a third gate barrier pattern disposed on the third gate dielectric pattern;
the first metal directly formed on the third gate barrier pattern;
a fourth metal directly formed on the first metal; and
a fifth metal directly formed on the fourth metal,
wherein the sum of thicknesses of the first metal and the second metal is greater than a thickness of the second metal, and the sum of thicknesses of the first metal and the fourth metal is smaller than the thickness of the second metal.

* * * * *